(12) United States Patent
Nakanishi et al.

(10) Patent No.: US 11,880,535 B2
(45) Date of Patent: *Jan. 23, 2024

(54) PROXIMITY SENSOR

(71) Applicant: Japan Display Inc., Tokyo (JP)

(72) Inventors: Takayuki Nakanishi, Tokyo (JP);
Naoki Takada, Tokyo (JP); Fumitaka Gotoh, Tokyo (JP); Shota Hosaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/988,367

(22) Filed: Nov. 16, 2022

(65) Prior Publication Data

US 2023/0072065 A1 Mar. 9, 2023

Related U.S. Application Data

(63) Continuation of application No. 17/410,475, filed on Aug. 24, 2021, now Pat. No. 11,531,432, which is a continuation of application No. 16/881,300, filed on May 22, 2020, now Pat. No. 11,144,165, which is a continuation of application No. 16/169,439, filed on Oct. 24, 2018, now Pat. No. 10,698,543.

(30) Foreign Application Priority Data

Nov. 29, 2017 (JP) .................................. 2017-228880

(51) Int. Cl.
*G06F 3/044* (2006.01)
*G06F 3/041* (2006.01)
*H03K 17/96* (2006.01)
*H03K 17/955* (2006.01)

(52) U.S. Cl.
CPC ............ *G06F 3/044* (2013.01); *G06F 3/0412* (2013.01); *G06F 3/0416* (2013.01); *G06F 3/0445* (2019.05); *G06F 3/0446* (2019.05); *G06F 3/0448* (2019.05); *G06F 3/041662* (2019.05); *H03K 17/955* (2013.01); *H03K 17/962* (2013.01); *G06F 2203/04103* (2013.01); *G06F 2203/04108* (2013.01); *H03K 2017/9615* (2013.01)

(58) Field of Classification Search
None
See application file for complete search history.

(56) References Cited

U.S. PATENT DOCUMENTS

| | | | | |
|---|---|---|---|---|
| 2014/0152915 | A1* | 6/2014 | Lu | G06F 3/0443 349/12 |
| 2016/0018915 | A1* | 1/2016 | Kuo | G06F 3/0346 345/173 |
| 2017/0235413 | A1* | 8/2017 | Koizumi | G06F 3/0445 345/174 |
| 2017/0262094 | A1* | 9/2017 | Badaye | G06F 3/0448 |

* cited by examiner

*Primary Examiner* — Duane N Taylor, Jr.
(74) *Attorney, Agent, or Firm* — Maier & Maier, PLLC

(57) ABSTRACT

A proximity sensor is arranged with a first electrode input with a first signal, a second electrode input with a second signal different from the first signal, a third electrode arranged closer to the first electrode than the second electrode, and the second signal has a reverse phase of the first signal.

6 Claims, 36 Drawing Sheets

PROXIMITY SENSOR

CROSS REFERENCE TO RELATED APPLICATIONS

This application is a continuation of U.S. application Ser. No. 17/410,475, filed Aug. 24, 2021, which is a continuation of U.S. application Ser. No. 16/881,300, filed May 22, 2020, which is a continuation of U.S. application Ser. No. 16/169,439, filed Oct. 24, 2018, and which is based upon and claims the benefit of priority from the prior Japanese Patent Application No. 2017-228880, filed on Nov. 29, 2017, the entire contents of each of which are incorporated herein by reference.

FIELD

An embodiment of the present invention relates to a proximity sensor and a display device.

BACKGROUND

Touch panels and proximity sensors are known as interfaces for a user to input information into a display device. By arranging a touch panel or proximity sensor in a display device, a user can operate input buttons or icons and the like displayed on the screen using the user's own finger or a touch pen. In addition, by arranging a touch panel or a proximity sensor in a display device, a user can scroll images displayed on the screen using the user's own finger or a touch pen.

For example, a system has been developed in which a pen sensor contacts a touch panel, and the system detects the input of the touch pen from the position where the touch pen contacts the touch panel.

SUMMARY

A proximity sensor is arranged with a first electrode input with a first signal, a second electrode input with a second signal different from the first signal, and a third electrode arranged closer to the first electrode than the second electrode.

A proximity sensor is arranged with a first electrode input with a first signal, a second electrode input with a second signal and having a larger area than the first electrode, and a third electrode arranged closer to the first electrode than the second electrode.

A display device is arranged with a display region panel including pixels arranged in a first direction and a second direction intersecting the first direction, and the proximity sensor described above has the first electrode arranged in the display region, and has the third electrode arranged on the outer side of the display region.

DESCRIPTION OF EMBODIMENTS

Figure 1:
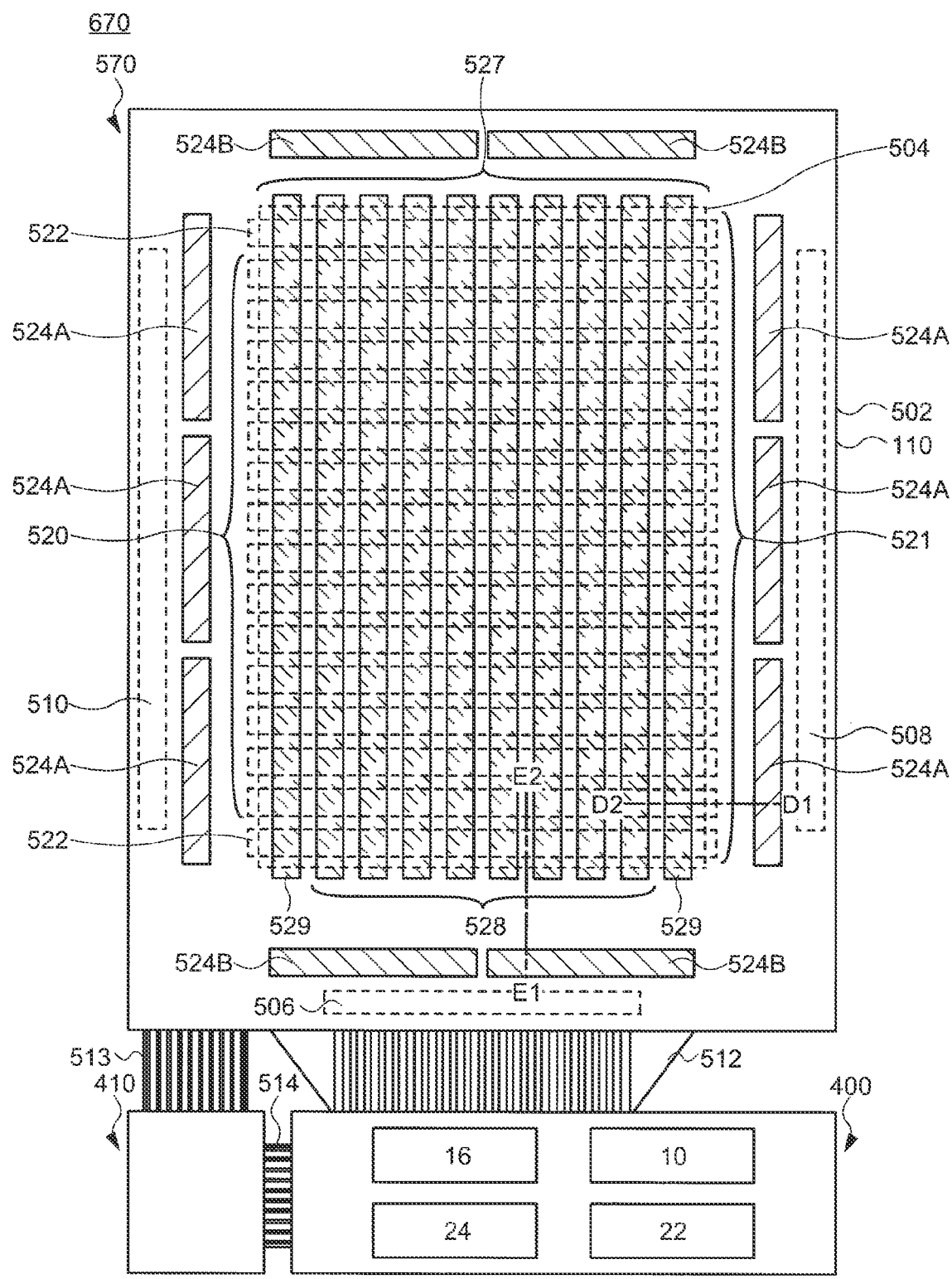
FIG. 1 is a schematic planar diagram showing a structure of a proximity sensor and a display device related to one embodiment of the present invention.

The embodiments of the present invention are explained below while referring to the drawings. However, the present invention can be implemented in many different without and should not to be interpreted as being limited to the description of the embodiments exemplified below. In addition, although the drawings may be schematically represented with respect to each part's structure as compared with their actual mode in order to make explanation clearer, it is only an example and an interpretation of the present invention is not limited. Furthermore, in the present specification and each drawing, the same reference symbols (or symbols such as A, B, a, b and the like attached after a numeral) are attached to the same elements as those described above with reference to preceding figures and a detailed explanation may be omitted accordingly. Furthermore, characters attached with [first], [second] to each element are appropriate signs used for distinguishing each element and do not have any further meaning unless otherwise explained.

In recent years, the demand for non-contact sensing technology has increased. Non-contact sensing technology is, for example, a technology for detecting the coordinates of a detection target which is projected on a display screen without a user touching the display screen. The detection target is, for example, a hand or a finger of a user separated from the display screen. By using non-contact sensing technology, it is possible for a user to operate input buttons and icons and the like displayed on the screen without touching the display screen. In addition, by using non-contact sensing technology, a user can scroll a screen without touching the display screen.

In non-contact sensing, for example, a change in capacitance between an electrode included in a proximity sensor arranged in a display device, and a hand or a finger of a user placed over a position separated from the display device is detected. In addition, in non-contact sensing, a change in capacitance is detected by shielding an electric field between electrodes included in a proximity sensor arranged in a display device by a hand or a finger of a user placed over a position separated from the display device. However, this change in capacity is small which makes non-contact sensing difficult. In addition, depending on the intensity of the electric field and the area of the electrode, the influence of a hand or finger of a user cannot be ignored, and a decrease in sensing sensitivity makes non-contact sensing difficult.

Therefore, an object of the present invention is to provide a proximity sensor capable of accurately detecting a detection target separated from a proximity sensor without contacting the proximity sensor, and to provide a display device mounted with the proximity sensor.

First Embodiment

In the present embodiment, a structure of a proximity sensor and a display device according to one embodiment of the present invention is explained.

FIG. 1 is a schematic planar diagram showing a structure of a display device 670 according to one embodiment of the present invention.

As is shown in FIG. 1, the display device 670 is arranged with, for example, a display panel 570, a circuit substrate 400, a circuit substrate 410, a connector 512, a connector 513 and a connector 514.

The display panel 570 includes a plurality of first touch electrodes 521 arranged in parallel in a horizontal direction in a top view, a plurality of second touch electrodes 527 arranged in parallel a vertical direction in a top view, a third electrode (Rx) 524A, a third electrode (Rx) 524B, a substrate 502, a substrate 110, a display region 504, an image signal line drive circuit 506, a scanning signal line drive circuit 508, and a scanning signal line drive circuit 510. The plurality of first touch electrodes 521 are formed from a first electrode (Txa) 522 and a plurality of second electrodes (Txb) 520. The plurality of second touch electrodes 527 are formed from a first electrode (Txa) 529 and a second electrode (Txb) 528. Furthermore, the display panel 570 may have either one of the scanning signal line drive circuit 508 and the scanning signal line drive circuit 510.

A projection type electrostatic capacity type proximity sensor is formed by the first electrode (Txa) 522, the second electrode (Txb) 520 and the third electrode (Rx) 524B. The first electrode (Txa) 522, the second electrode (Txb) 520, and the third electrode (Rx) 524B do not have to overlap each other when viewed from the top surface of the display panel. In addition, in the cross-section of the display panel, the first electrode (Txa) 522 and the second electrode (Txb) 520 may be arranged lower than the third electrode (Rx) 524B. In addition, in the cross-section of the display panel, the first electrode (Txa) 522 and the second electrode (Txb) 520 may be also be arranged higher than the third electrode (Rx) 524B. In one embodiment of the present invention, in the cross-section of the display panel, the first electrode (Txa) 522 and the second electrode (Txb) 520 are arranged lower than the third electrode (Rx) 524B. In addition, the third electrode (Rx) 524B, the first electrode (Txa) 522, and the second electrode (Txb) 520 are arranged to become closer in this order with respect to end surface (for example, end surface of the substrate) of a surface arranged with each electrode. The second electrode (Txb) 520 is arranged adjacent to the first electrode (Txa) 522. The third electrode (Rx) 524B is arranged adjacent to the first electrode (Txa) 522. A predetermined signal is input to the first electrode (Txa) 522. A signal which has a different phase from the phase of the predetermined signal is input to the second electrode (Txb) 520.

In addition, a projection type electrostatic capacity type proximity sensor is formed by the first electrode (Txa) 529, the second electrode (Txb) 528, and the third electrode (Rx) 524A. The first electrode (Txa) 529, the second electrode (Txb) 528 and the third electrode (Rx) 524A do not have to overlap each other when viewed from the top surface of the display panel. In addition, in the cross-section of the display panel, the first electrode (Txa) 529 and the second electrode (Txb) 528 may be arranged lower than the third electrode (Rx) 524A. In addition, the first electrode (Txa) 529 and the second electrode (Txb) 528 may be arranged higher than the third electrode (Rx) 524A. In one embodiment of the present invention, in the cross-section of the display panel, the first electrode (Txa) 529 and the second electrode (Txb) 528 are arranged on the same plane as the third electrode (Rx) 524A. In addition, the third electrode (Rx) 524 A, the first electrode (Txa) 529 and the second electrode (Txb) 528 are arranged so as to become closer in this order with respect to an end surface (for example, substrate end surface) of a surface on which each electrode is arranged. The second electrode (Txb) 528 is arranged adjacent to the first electrode (Txa) 529. The third electrode (Rx) 524A is arranged adjacent to the first electrode (Txa) 529. A predetermined signal is input to the first electrode (Txa) 529. A signal which has a different phase to the phase of the predetermined signal is input to the second electrode (Txb) 528. The projection type electrostatic capacitance type of sensor method is roughly separated into a self-capacitance type and a mutual capacitance type.

In the self-capacitance type, a detection target such as a human finger touches or comes near to (referred to herein as touching when in the case where touching and approaching are referred to collectively) the display region 504 via the first electrode (Txa) 522 and the third electrode (Rx) 524B, thereby capacitance generated between the detection target and the first electrode (Txa) 522 or the third electrode (Rx) 524 is added to the parasitic capacitance in the first electrode (Txa) 522 and the third electrode (Rx) 524B. The position of the touch is detected by reading this change. Furthermore, the case of the self-capacitance type which uses the first electrode (Txa) 529 and the third electrode (Rx) 524A is also the same as the case where the first electrode (Txa) 522 and the third electrode (Rx) 524B are used.

In the mutual capacitive type, the first electrode (Txa) 522 and the second electrode (Txb) 520 are also called a transmitting electrode (Tx) and the third electrode (Rx) 524B is also called a receiving electrode (Rx). When a detection target such as a human finger touches the display region 504 via the first electrode (Txa) 522 and the third electrode (Rx) 524B, a capacitance formed by the first electrode (Txa) 522 and the third electrode (Rx) 524B changes, and the position of the touch is detected by reading this change. In the case where the distance between the detection target such as a human hand or finger and the first electrode (Txa) 522 and the third electrode (Rx) 524 B is not close, for example, in the third electrode (Rx) 524B and the first electrode (Txa) 522, by making the area of one electrode larger than the area of the other electrode, it is possible to improve the detection sensitivity of the detection target. However, since an electric field which is generated from the electrode becomes strong when the area of the electrode is increased, the detection target such as a human hand and the electrode mutually affect each other and there is a possibility that the detection sensitivity is lowered. Furthermore, the case of the mutual capacitance type which uses the first electrode (Txa) 529 and the third electrode (Rx) 524A is also the same as the case where the first electrode (Txa) 522, the second electrode (Txb) 520 and the third electrode (Rx) 524B are used.

In the display device 670 according to one embodiment of the present invention, contact type sensing is performed when a finger touches with the display panel 570, a pulse signal is applied in time series in order, for example, from an upper electrode in a top surface view of a plurality of first touch electrodes 521. One of the plurality of second touch electrodes 527 detects a change in a pulse signal at a position where the finger touches the display panel 570. In this way, it is possible to perform touch detection in a contact state.

In addition, in the display device 670 according to one embodiment of the present invention, non-contact sensing is when a hand is held over the display panel 570, a predetermined signal is input, for example, to the first electrode (Txa) 522 among the plurality of first touch electrodes 521. At the same time, a signal having a different phase from the phase of the predetermined signal is input to the second electrode (Txb) 520 among the plurality of first touch electrodes 521. The hand receives an electric field of the second electrode (Txb) 520, and the predetermined signal is transmitted to the third electrode (Rx) 524B via both a capacitance formed between the second electrode (Txb) 520 and the hand and a capacitance formed between the hand and the third electrode (Rx) 524B. The first electrode (Txa) 522, the second electrode (Txb) 520, and the third electrode (Rx) 524 are used as mutually capacitive type proximity sensors even when the detection target, the proximity sensor and the display device are not in contact with each other, thereby it is possible to detect the position where the hand is held over. Furthermore, in the case when the first electrode (Txa) 522 and the second electrode (Txb) 520 are used for touch detection, the third electrode (Rx) 524B is used and the third electrode (Rx) 524A is not used. Similarly, a predetermined signal is input to the first electrode (Txa) 529 among the plurality of second touch electrodes 527, and a signal having a different phase from the phase of the predetermined signal is input to the second electrode (Txb) 528 among the plurality of second touch electrodes 527. The hand receives an electric field of the second electrode (Txb) 528, and the predetermined signal is transmitted to the third electrode (Rx) 524A via both a capacitance formed between the second electrode (Txb) 528 and the hand, and between the hand and the third electrode (Rx) 524A. The first electrode (Txa) 529, the second electrode (Txb) 528, and the third electrode (Rx) 524 are used as mutually capacitive type proximity sensors even when the detection target, the proximity sensor and the display device are not in a non-contact state with each other, thereby it is possible to detect the position where the hand is held over. Furthermore, in the case when the first electrode (Txa) 529 and the second electrode (Txb) 528 are used for touch detection, the third electrode (Rx) 524A is used and the third electrode (Rx) 524B is not used. Furthermore, it is possible to detect a touch position by inputting different signals to each of the plurality of second electrodes (Txb) 520 included in the first touch electrode 521 and detecting a change in the amplitude of the input signal. Performing touch detection by inputting a predetermined signal to the first electrode (Txa) 522, and performing touch detection by inputting different signals to each of the plurality of first touch electrodes 521 included in the second electrode (Txb) 520 can be switched by a signal supply circuit 24 included in the circuit substrate 400.

According to FIG. 1, an example is shown in which the display panel 570 is held between the substrate 502 and the substrate 110. A display region 504, an image signal line drive circuit 506, a scanning signal line drive circuit 508, a scanning signal line drive circuit 510, and a plurality of first touch electrodes 521 are formed on the substrate 502. The connector 512 is electrically connected to the substrate 502. The plurality of second touch electrodes 527 are formed between the substrate 502 and the substrate 110 and between the plurality of first touch electrodes 521 and the substrate 110. The connector 513 is electrically connected to the substrate 110. It is not necessary that all of the image signal line drive circuit 506 and the scanning signal line drive circuits 508 and the scanning signal line drive circuits 510 be formed on the substrate 502. For example, an integrated circuit (IC) (not shown in the diagram) including a part or all of the functions of the image signal line drive circuit 506 and the scanning signal line drive circuits 508 and the scanning signal line drive circuits 510 is formed on the substrate 502 or on the connector 512.

The substrate 502 and the substrate 110 may be a hard base material substrate such as a glass substrate, or a base material having flexibility. A hard base material such as a glass substrate can include materials exemplified by, for example, a glass substrate, a quartz substrate and a ceramic substrate. By using a hard base material such as a glass substrate for the substrate 502, it is possible to provide the display panel 570 with high rigidity. The base material having flexibility can include, for example, a material selected from polymer materials exemplified by polyimide, polyamide, polyester and polycarbonate. By using a base material having flexibility for the substrate 502 and the substrate 110, it is possible to provide a light and thin display panel 570.

Figure 8:
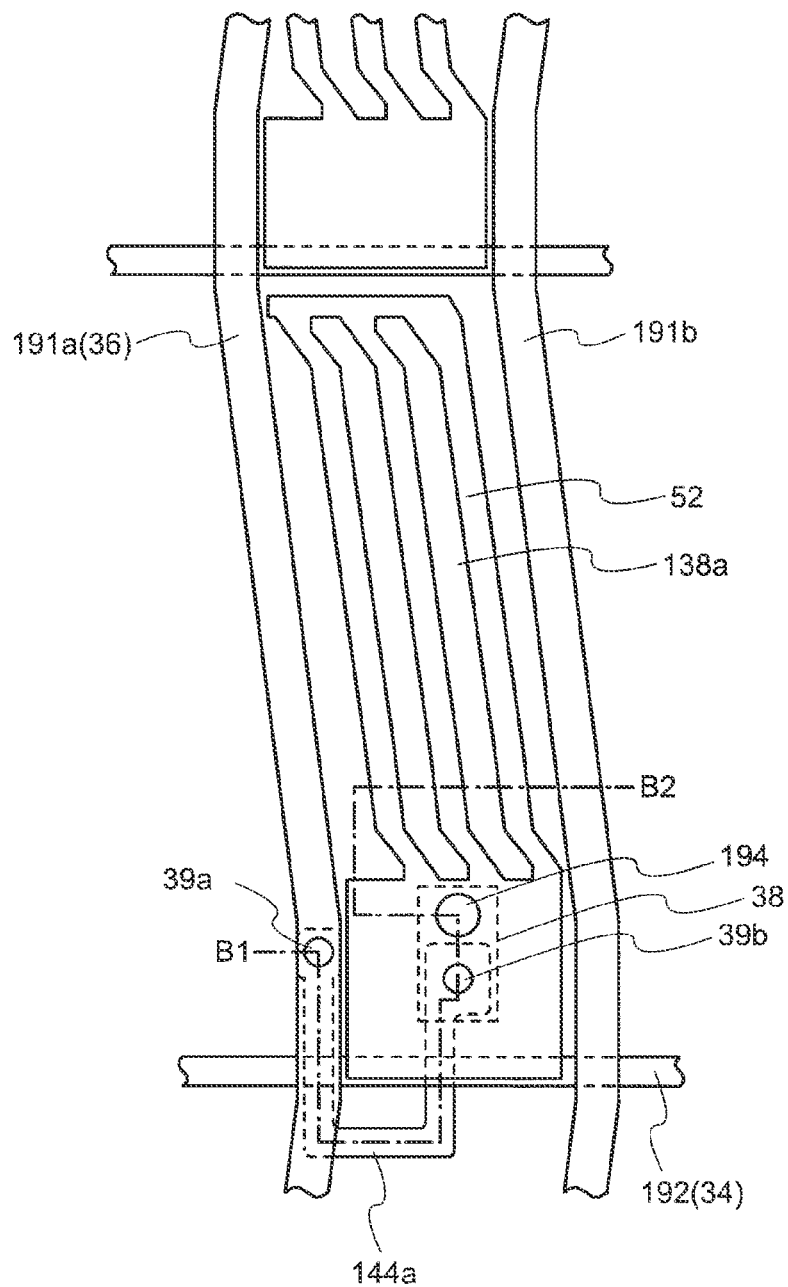
FIG. 8 is one example of a pixel layout included in a display device related to one embodiment of the present invention.

The display region 504 includes a plurality of pixels 120 (shown in FIG. 8). The plurality of pixels 120 are arranged along a first direction and a second direction intersecting the first direction. The arrangement number of the plurality of pixels 120 is arbitrary. For example, with the X direction set as the first direction and the Y direction set as the second direction, m pixels are arranged in the X direction and n pixels 120 are arranged in the Y direction. m and n are each independently a natural number larger than 1. The display region 504 includes a region in which the pixels 120 are arranged along a first direction and a second direction intersecting the first direction. Each of the pixels 120 includes a display element. The display element includes, for example, a liquid crystal element or an organic EL element. In the present specification, the case where the display panel 570 includes a liquid crystal element is explained as an example.

In the pixel 120, for example, it is possible to arrange display elements corresponding to the three primary colors of red (R), green (G), and blue (B) for each of three pixels. By supplying a voltage of 256 levels or a current to each pixel, it is possible to provide a full color display device. In addition to the three primary colors, the pixel 120 may also include a display element corresponding to white or yellow. In addition, the arrangement of the plurality of pixels 120 is not limited. For example, a stripe arrangement or a delta arrangement and the like may be adopted.

The circuit substrate 400 includes at least a timing generation circuit part 16, a signal detection circuit part 10, a signal supply circuit 24 and a power supply circuit 22. In addition, the circuit substrate 400 is electrically connected to the circuit substrate 410 via the connector 514.

The timing generation circuit part 16 can generate a signal for touch detection. The timing generation circuit part 16 can generate one or more signals. In addition, the generated signal may be a plurality of the same signals, a plurality of mutually different signals, or the same signal and a plurality of mutually different signals. The signals may be appropriately selected within a scope that does not depart from the structure according to the present invention. The generated signal is supplied to the first electrode (Txa) 522, the first electrode (Txa) 529, the second electrode (Txb) 520 and the second electrode (Txb) 528.

The signal detection circuit part 10 is electrically connected to the third electrode (Rx) 524A and the third electrode (Rx) 524B. The signal detection circuit part 10 can detect a signal when the proximity sensor or the display device is touched. The detected signal is supplied from the circuit substrate 400 to the display panel 570 via the connector 512. In addition, the detected signal is supplied from the circuit substrate 400 to the display panel 570 via the connector 514, the circuit substrate 410 and the connector 513. Furthermore, the signal when the touch is made is supplied from the display panel 570 to the circuit substrate 400 via the connector 512. In addition, a signal when the touch is made is supplied from the display panel 570 to the circuit substrate 400 via the connector 513, the circuit substrate 410 and the connector 514.

A flexible printed circuit (FPC) can be used as the connector 512, the connector 513, and the connector 514.

Furthermore, the circuit substrate 410 may also include a timing generation circuit part 16, a signal detection circuit part 10, a signal supply circuit 24 and a power supply circuit 22.

The signal supply circuit 24 generates an image signal and a timing signal for controlling the operation of the circuit. In addition, the power supply circuit 22 supplies power to the timing generation circuit part 16, the signal detection circuit part 10, the signal supply circuit 24 and the display panel 570. The connector 512 also has the role of supplying an image signal, a timing signal for controlling the operation of the circuit, and a power supply to the image signal line drive circuit 506, the scanning signal line drive circuit 508 and the scanning signal line drive circuit 510.

The image signal line drive circuit 506, the scanning signal line drive circuit 508 and the scanning signal line drive circuit 510 drive each pixel 120 using a supplied image signal, a timing signal for controlling the operation of the circuit, and a power supply, and has the role of displaying an image in the display region 504.

Figure 2:
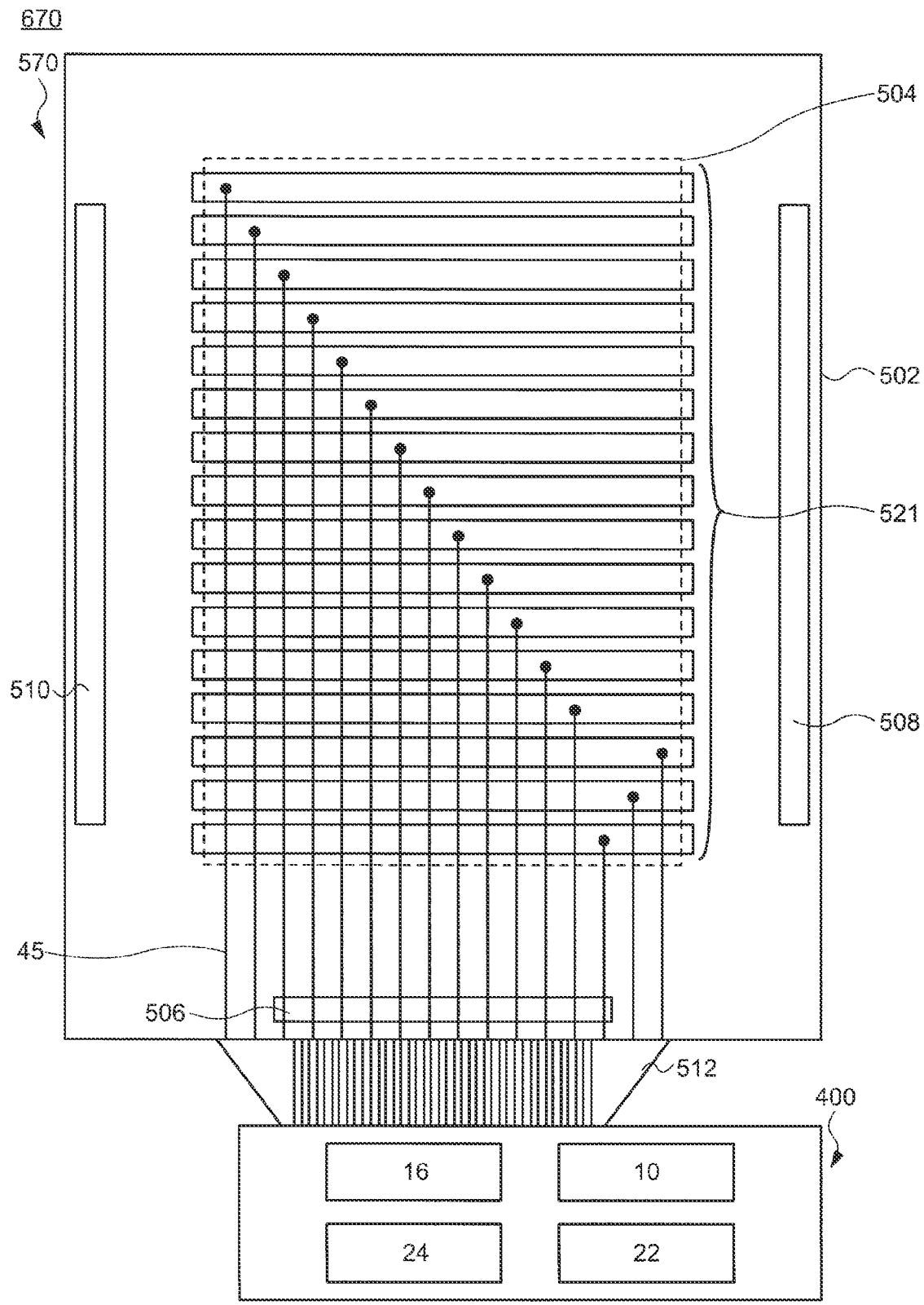
FIG. 2 is a schematic planar diagram showing a structure of a proximity sensor and a display device related to one embodiment of the present invention.

FIG. 2 is a schematic planar diagram showing a structure of the proximity sensor and the display device according to one embodiment of the invention. In order to promote understanding, FIG. 2 shows an excerpt of a plurality of first touch electrodes 521, a substrate 502, a display region 504, an image signal line drive circuit 506, a scanning signal line drive circuit 508, a scanning signal line drive circuit 510, the circuit substrate 400 and the connector 512 in the display panel 570. Furthermore, FIG. 2 is the same as FIG. 1 except that a first connection wiring 45 is illustrated. The same structure as in FIG. 1 is omitted here.

The first connection wiring 45 electrically connects the plurality of first touch electrodes 521 and the connector 512. The first connection wiring 45 is independently and electrically connected to each of the plurality of first touch electrodes 521. Therefore, each of the plurality of first touch electrodes 521 is controlled independently.

Figure 3:
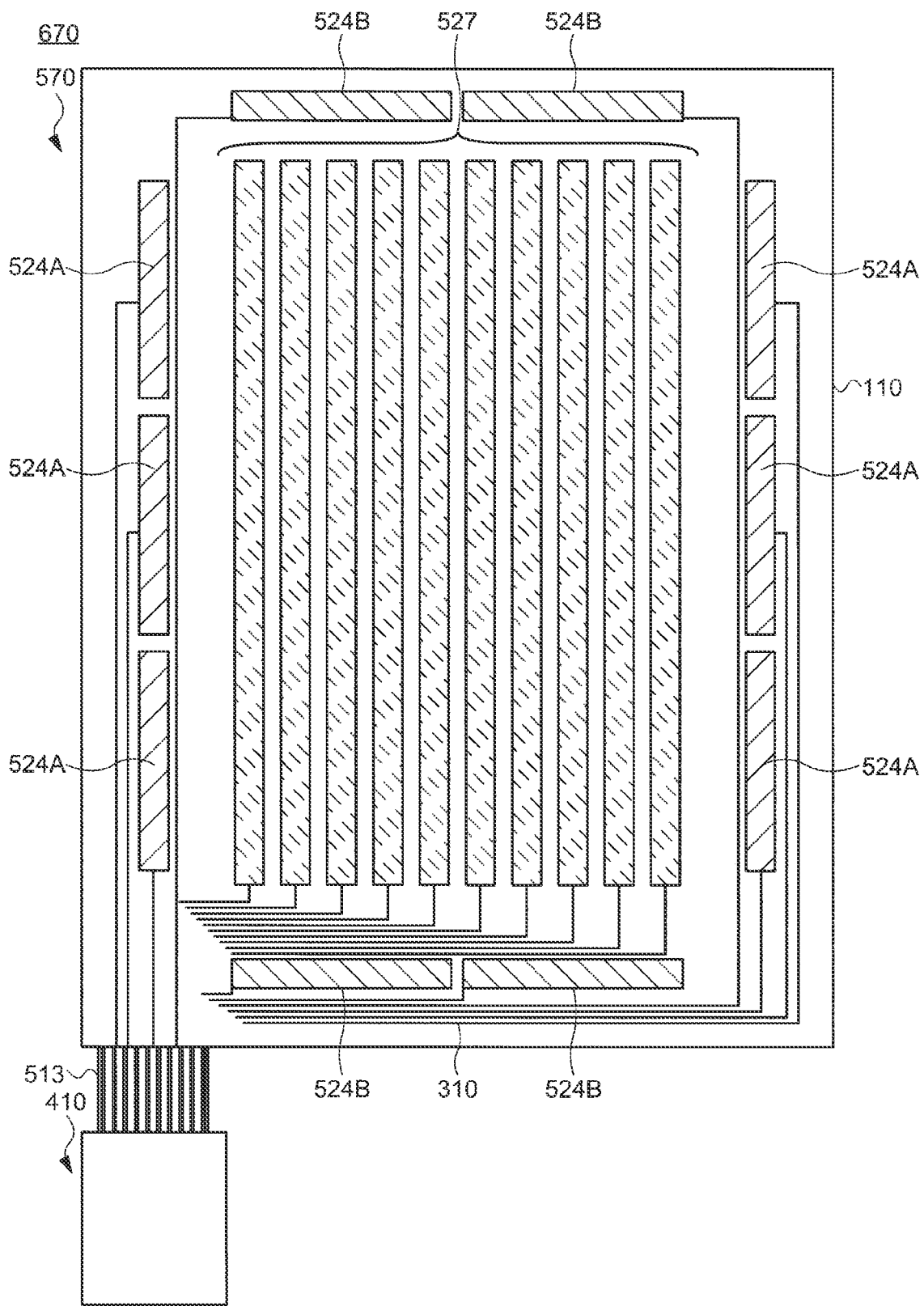
FIG. 3 is a schematic planar diagram showing a structure of a proximity sensor and a display device related to one embodiment of the present invention.

FIG. 3 is a schematic planar diagram showing a structure of a proximity sensor and a display device according to one embodiment of the invention. In order to promote understanding, FIG. 3 shows an excerpt of a plurality of second touch electrodes 527, a third electrode (Rx) 524A and a third electrode (Rx) 524B in the display panel 570. Furthermore, FIG. 3 is the same as FIG. 1 except that a second connection wiring 310 is illustrated. The same structure as in FIG. 1 is omitted here.

The second connection wiring 310 electrically connects the plurality of second touch electrodes 527, the third electrode (Rx) 524A and the third electrode (Rx) 524B and the connector 513. The second connection wiring 310 is independently and electrically connected to each of the plurality of second touch electrodes 527, the third electrode (Rx) 524A and the third electrode (Rx) 524B. Therefore, each of the plurality of second touch electrodes 527, the third electrode (Rx) 524A and the third electrode (Rx) 524B is controlled independently.

Figure 4:
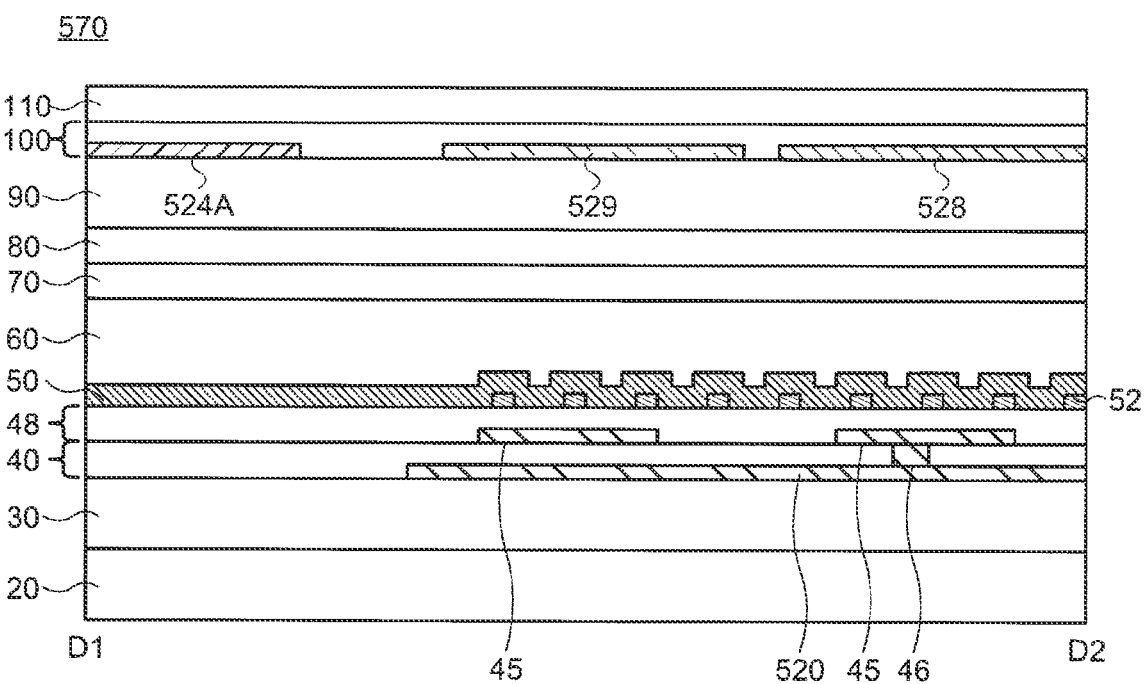
FIG. 4 is a schematic cross-sectional diagram showing a structure of a proximity sensor and a display device related to one embodiment of the present invention.
Figure 5:
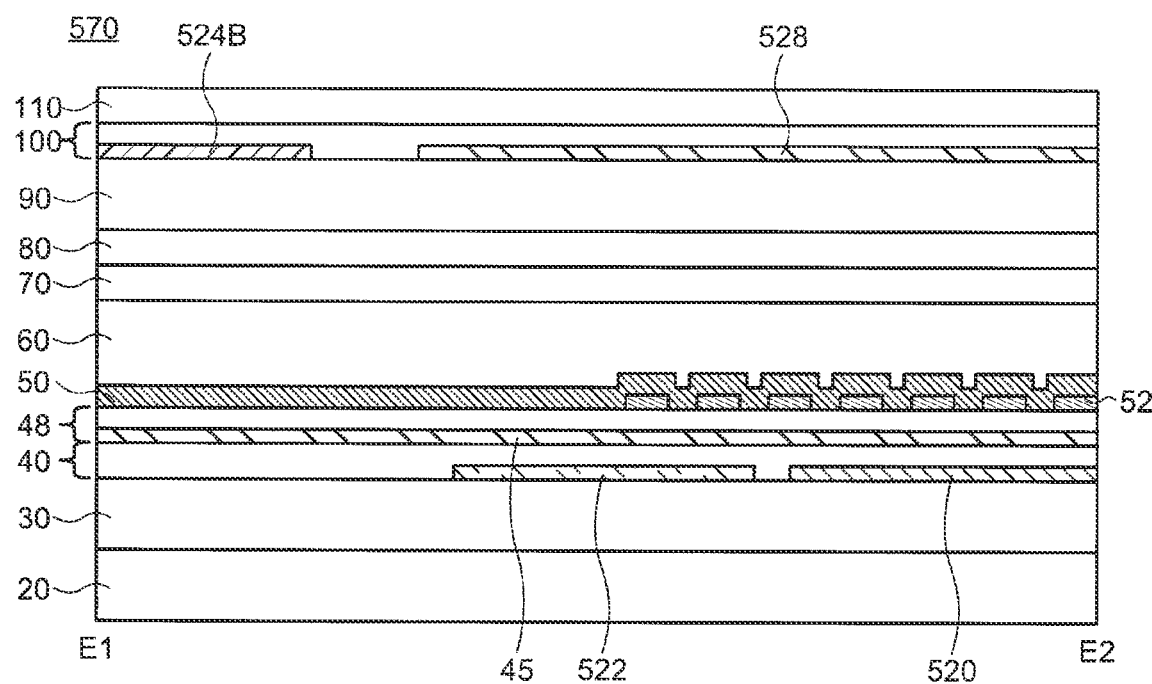
FIG. 5 is a schematic cross-sectional diagram showing a structure of a proximity sensor and a display device related to one embodiment of the present invention.

FIG. 4 and FIG. 5 are schematic cross-sectional diagrams showing structures of a proximity sensor and a display device according to one embodiment of the present invention. FIG. 4 shows a cross-section of the region shown by D1 and D2 in FIG. 1. FIG. 5 shows a cross-section of the region shown by E1 and E2 in FIG. 1. The display panel 570 includes a substrate 20, a TFT array layer 30, a common electrode layer 40, a connection wiring layer 48, a first oriented film 50, a liquid crystal layer 60, a second oriented film 70, a color filter layer 80, an opposing substrate 90, a first touch electrode layer 100 and a substrate 110. Furthermore, the substrate 20 is the same as the substrate 502 shown in FIG. 2. The pixel electrode 52 included in the pixel 120 is arranged between the common electrode layer 40 and the first oriented film 50. In the opposing substrate 90, a third electrode (Rx) 524A and third electrode (Rx) 524B are arranged on a rear surface of the surface on which the color filter layer 80 is arranged.

The connection wiring layer 48 includes the first connection wiring 45. The first connection wiring 45 is electrically connected to the first electrode (Txa) 522 and the plurality of second electrodes (Txb) 520 via a third opening part 46.

The TFT array layer 30, the common electrode layer 40 and the first touch electrode layer 100 are arranged on the substrate 502. A transistor included in the display region 504, the image signal line drive circuit 506, the scanning signal line drive circuits 508 and the scanning signal line drive circuits 510 and a terminal electrode 516 (not shown in the diagram) are arranged in the TFT array layer 30. The terminal electrode 516 is electrically connected to the connector 512. The common electrode layer 40 is arranged with a first electrode (Txa) 522 and a second electrode (Txb) 520. A first electrode (Txa) 529, second electrode (Txb) 528, third electrode (Rx) 524A and a third electrode (Rx) 524B are arranged in the first touch electrode layer 100. Each of the signal lines electrically connected to the image signal line drive circuit 506, the scanning signal line drive circuit 508 and the scanning signal line drive circuit 510 is electrically connected to the terminal electrode 516. Therefore, an image signal, a timing signal for controlling the operation of a circuit, and a power supply are supplied from the connector 512 to the image signal line drive circuit 506, the scanning signal line drive circuit 508 and the scanning signal line drive circuit 510 via the terminal electrode 516. In addition, each of the first connection wirings 45 electrically connected to the first electrode (Txa) 522, the second electrode (Txb) 520 and the third electrode (Rx) 524B is also electrically connected to the terminal electrode 516. Therefore, a signal for touch detection and a signal when a touch is made are transmitted from the connector 512 via the terminal electrode 516 to the first electrode (Txa) 522, the second electrode (Txb) 520 and the third electrode (Rx) 524B. Furthermore, the second connection wiring 310 electrically connected to the first electrode (Txa) 529, the second electrode (Txb) 528 and the third electrode (Rx) 524A is electrically connected to a terminal electrode 516 (not shown in the diagram) formed on the opposing substrate 90. The terminal electrode 516 (not shown in the diagram) formed on the opposing substrate 90 is electrically connected to the connector 513. Therefore, a signal for touch detection and a signal when a touch is made are transmitted from the connector 513 via the terminal electrode 516 to the first electrode (Txa) 529, the second electrode (Txb) 528 and the third electrode (Rx) 524A.

The TFT array layer 30 includes a plurality of transistors 190, a capacitor element, a resistor element and each type of wiring. The TFT array layer 30 is a layer formed with a transistor 190 of the display region 540, the image signal line drive circuit 506 and the scanning signal line drive circuit 508 based on the plurality of transistors 190, the capacitor element, the resistor element and each type of wiring. The TFT array layer 30 has the role of driving the display panel 570.

When an image is displayed on the display panel 570, a common voltage of 0V, for example, is applied to the first electrode (Txa) 522 and the second electrode (Txb) 520 included in the common electrode layer 40. When a voltage is applied to the first electrode (Txa) 522 and the second electrode (Txb) 520, liquid crystal elements included in the liquid crystal layer 60 are controlled by the voltages applied to the pixel electrode 52. At this time, a common voltage of 0V may also be applied to the third electrode (Rx) 524A and the third electrode (Rx) 524B.

Figure 6:
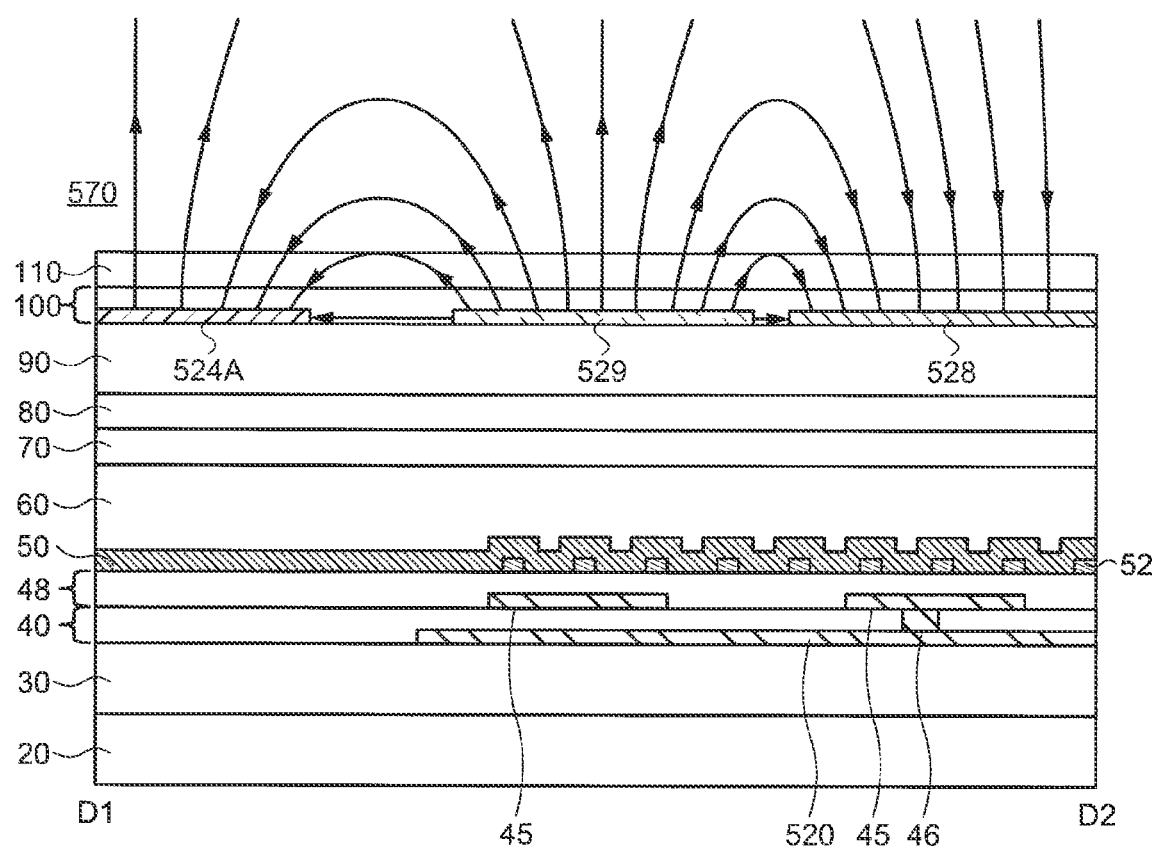
FIG. 6 is a schematic cross-sectional diagram showing an example of electric lines of force in a proximity sensor and a display device related to one embodiment of the present invention.
Figure 7:
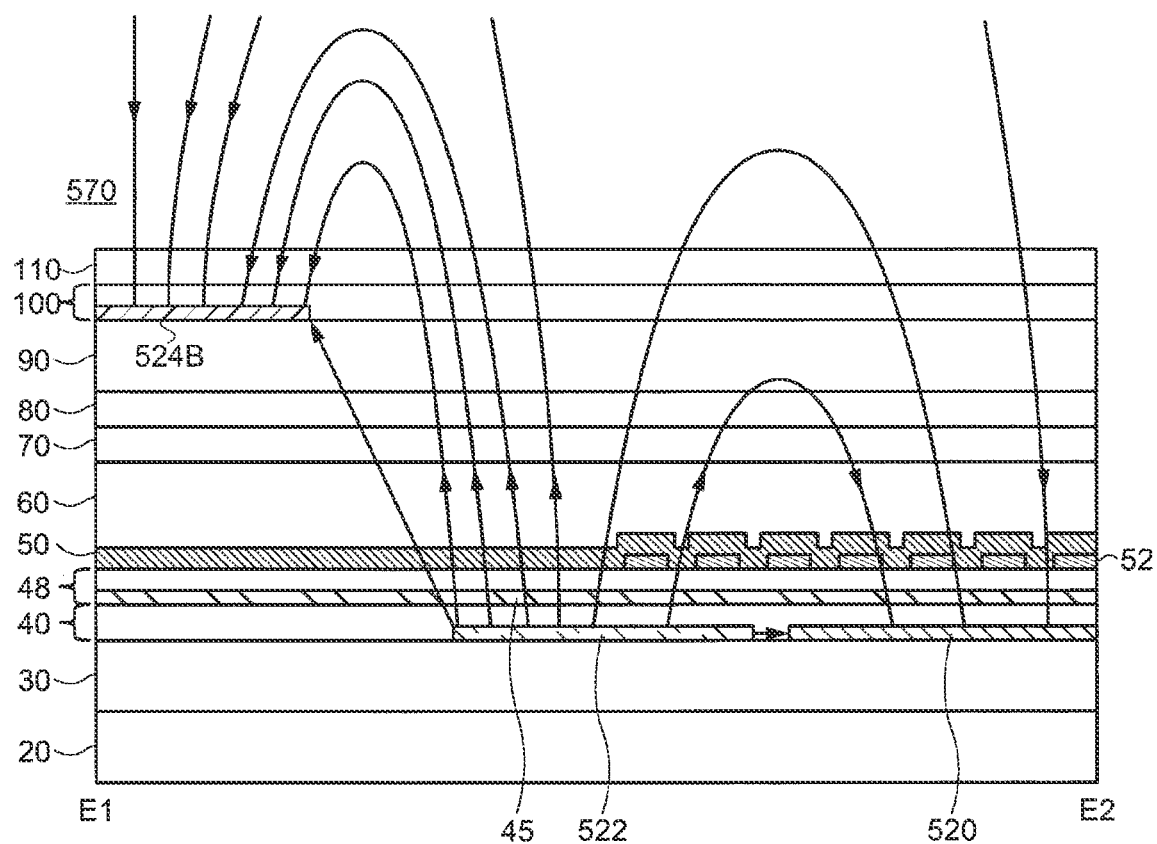
FIG. 7 is a schematic cross-sectional diagram showing an example of electric lines of force in a proximity sensor and a display device related to one embodiment of the present invention.

FIG. 6 and FIG. 7 are schematic cross-sectional diagrams showing examples of electric lines of force of a display panel according to one embodiment of the present invention. FIG. 6 shows a cross-section of a region shown by D1 and D2 shown in FIG. 1. FIG. 7 shows a cross-section of a region shown by E1 and E2 shown in FIG. 1.

FIG. 6 is a graph schematically showing electric lines of force in an electric field generated between the first electrode (Txa) 529 and the second electrode (Txb) 528, electric lines of force in an electric field generated between the second electrode (Txb) 528 and the third electrode (Rx) 524A, and electric lines of force in an electric field generated between the first electrode (Txa) 529 and the third electrode (Rx) 524A when a touch is detected.

FIG. 7 is a diagram schematically showing electric lines of force in an electric field generated between the first electrode (Txa) 522 and the second electrode (Txb) 520, electric lines of force in an electric field generated between the second electrode (Txb) 520 and the third electrode (Rx) 524B, and electric lines of force in an electric field generated between the first electrode (Txa) 522 and the third electrode (Rx) 524B when a touch is detected. Touch detection and writing new image data to a pixel are not carried out at the same time.

FIG. 8 shows an example of a pixel layout of a display device according to one embodiment of the present invention. The pixel 120 has a structure which can be applied to an FFS (Fringe Field Switching) mode or IPS (In Plane Switching) mode. The display panel 500 including the pixel 120 controls the orientation of liquid crystal molecules which form the liquid crystal layer 60 mainly utilizing a transverse electric field (for example, an electric field almost parallel to the main surface of the substrate among the fringe electric fields) which is formed between the first electrode (Txa) 522 and the second electrode (Txb) 520 included in the pixel electrode 52 and the common electrode layer 40.

Figure 9:
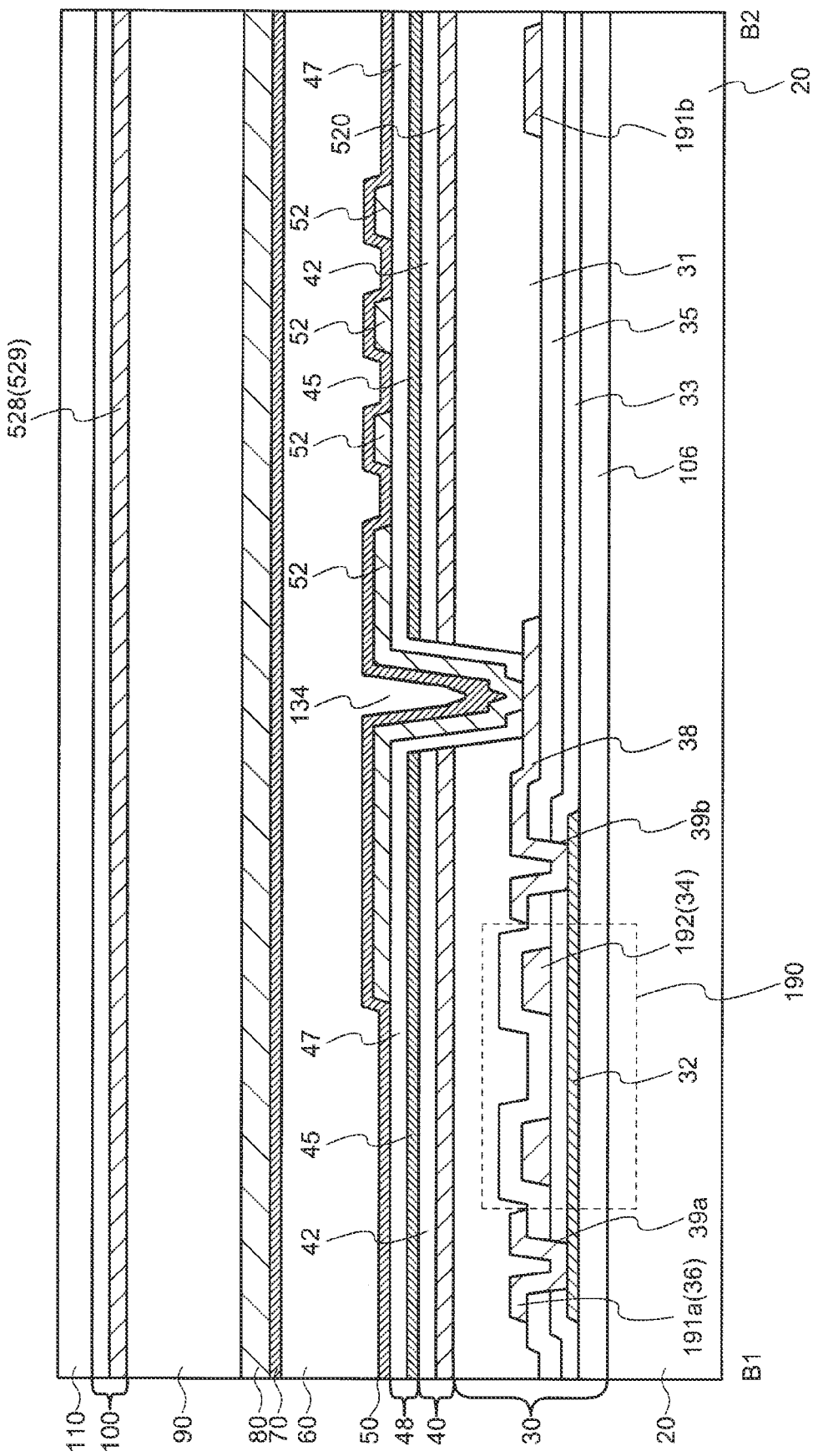
FIG. 9 is a schematic cross-sectional diagram showing one example of a pixel included in a display device related to one embodiment of the present invention.

A pixel 120 shown in FIG. 8 includes a transistor 190, an image signal line 191, a scanning signal line 192 and a pixel electrode 52. The transistor 190 includes a semiconductor film 32, a gate electrode 34, a source or drain electrode 36 and a source or drain electrode 38, a first opening part 39a and a first opening part 39b. The source or drain electrode 36 and the source or drain electrode 38 are electrically connected to the semiconductor film 32 via the first opening part 39a and the first opening part 39b. The pixel electrode 52 is electrically connected to the source or drain electrode 38 via a second opening part 194. A capacitor element is formed by the source or drain electrode 38, the first electrode (Txa) 522, and the planarization film 31 described later, the first electrode (Txa) 522, the pixel electrode 52, and an organic film 42. The source or drain electrode 36 and the image signal line 191a are electrically connected to each other. The image signal line 191b is an image signal line of an adjacent pixel. The gate electrode 34 and the scanning signal line 192 are electrically connected to each other. When an image is displayed on the display panel 500, the first electrode (Txa) 522 has the role of supplying a common voltage to all the pixels 120 included in the display region 504. An electric field is generated between the pixel electrode 52 and the first electrode (Txa) 522 by applying a voltage to each of the pixel electrode 52 and the first electrode (Txa) 522 respectively. A liquid crystal element included in the liquid crystal layer 60 is controlled based on the generated electric field. Therefore, the display panel 500 can display images. Furthermore, FIG. 8 exemplifies a mode in which the semiconductor film 32 has a U-shaped shape and intersects the gate electrode 34. In one embodiment of the present invention, the shape of the semiconductor film 32 is not limited to the shape shown in FIG. 8. It is possible to apply various shapes such as an L shape or I shape to the shape of the semiconductor film 32 which forms the transistor 190. In addition, the structure of the transistor 190 is not limited to a double gate structure. The structure of the transistor 190 may also be a single gate structure or a multi-gate structure in which a gate electrode is arranged so that two or more channels are arranged in series or in parallel between a source electrode and a drain electrode. In addition, examples of a material for forming the semiconductor film 32 in the transistor 190 include polysilicon, amorphous silicon and an oxide semiconductor. Furthermore, an example in which the structure of the transistor 190 is a top gate type is shown in FIG. 9 described later. A bottom gate type may also be applied as the structure of the transistor 190. The shape of the semiconductor film 32, the material for forming the semiconductor film 32, and the structure of the transistor 190 may be appropriately examined according to the specifications or use of the display device without departing from the scope of one embodiment of the present invention.

In the present specification, the first electrode (Txa) 522 is one of the electrodes of the proximity sensor at the time of touch detection.

FIG. 9 is a schematic cross-sectional diagram of a display panel according to one embodiment of the present invention and includes a cross-section of a region shown by B1 and B2 of the pixel shown in FIG. 8. A manufacturing method of the display panel 570 is explained using FIG. 9. Furthermore, the manufacturing method of the display panel 570 according to one embodiment of the present invention explained here is one example, and the manufacturing method of the display panel 570 according to one embodiment of the present invention is not limited to the manufacturing method explained here. The manufacturing method of the display panel 570 according to one embodiment of the present invention is explained using an example of utilizing a photolithography technique used in the manufacture of display panels. However, the manufacturing method of the display panel 570 according to one embodiment of the present invention is not limited to a photolithography technique, and any manufacturing method usually used in the technical field of the present invention may be adopted.

First, the TFT array layer 30 is formed on the substrate 20. The TFT array layer 30 includes a base film 106, a semiconductor film 32, a gate insulating film 33, a gate electrode 34, an interlayer film 35, a source or drain electrode 36 and a source or drain electrode 38, a first opening part 39a and a first opening part 39b, and a planarization film 31. A transistor 190 and a capacitor are formed In the TFT array layer 30.

The planarization film 31 relieves irregularities caused when a film, a wiring, or a transistor is formed in a layer below the planarization film 31. Therefore, it is possible to form a film or a pattern on a flat surface after forming the planarization film 31.

It is possible to adopt methods and members which are commonly used in the technical field of the present invention for the method for forming the TFT array layer 30, the structure of the transistor 190 and the capacitor, and for each film, layer and each member. For example, it is possible to use polyimide or acrylic resin as a material for forming the planarization film 31. It is possible to allow light to sufficiently be transmitted by using polyimide or acrylic resin.

A common electrode layer 40 is formed above the planarization film 31. The common electrode layer 40 is formed from a first electrode (Txa) 522 and an organic film 42. After each electrode is formed, the organic film 42 is coated so as to cover each electrode. By coating the organic film 42 so as to cover each electrode, it is possible to prevent the respective electrodes from contacting and conducting with each other. The organic film 42 relieves irregularities caused when a film, a wiring, or a transistor is formed in a layer below the organic film 42. Therefore, a film or pattern formed after the formation of the organic film 42 is formed on a flat surface. The material for forming the first electrode (Txa) 522 is preferred to have translucency and has conductivity. For example, ITO (Indium Tin Oxide) and IZO (Indium Zinc Oxide) can be used. In addition, the same material as the material for forming the planarization film 31 can be used as the material for forming the organic film 42.

Next, a third opening part 46 (shown in FIG. 6) for opening the organic film 42 is formed. The first electrode (Txa) 522 and the first connection wiring 45 are electrically connected via the third opening part 46. In addition, the second electrode (Txb) 520 and the first connection wiring 45 are electrically connected via the third opening part 46.

Next, a connection wiring layer 48 is formed on the organic film 42. The connection wiring layer 48 is formed from the first connection wiring 45 and the organic film 42. After the first connection wiring 45 is formed on the organic film 42, an opening part is formed which passes through the first connection wiring 45, the organic film 42, the first electrode (Txa) 522 and the second electrode (Txb) 520. An organic insulating film 47 is coated so as to cover the first connection wiring 45 and this opening part. The material for forming the first electrode (Txa) 522 and the second electrode (Txb) 520 is preferred to have translucency and conductivity. For example, ITO (Indium Tin Oxide) and IZO (Indium Zinc Oxide) can be used. Furthermore, a thin film made of a conductive metal material such as Al, Ti, or W may also be used. The same material as the material for forming the organic film 42 and the planarization film 31 can be used as a material for forming the organic insulating film 47.

Next, a second opening part 194 for electrically connecting the pixel electrode 52 and the source or drain electrode 38 is formed. The second opening part 194 opens the organic insulating film 47.

Next, after the pixel electrode 52 is formed, a first oriented film 50 is coated so as to cover the pixel electrode 52. The first oriented film 50 is arranged on a surface of the substrate 20 facing the liquid crystal layer 60. The first oriented film 50 is formed from a material which shows horizontal oriented properties for example. By coating the first oriented film so as to cover each pixel electrode, it is possible to prevent the pixel electrodes of the respective pixels from contacting and conducting with each other. The pixel electrode 52 is connected to the source or drain electrode 38 of a pixel, and a voltage corresponding to the image signal is applied. A voltage corresponding to an image signal is applied to the pixel electrode 52. It is possible to drive a liquid crystal element included in the liquid crystal layer 60 based on the application of a voltage corresponding to an image signal to a pixel electrode 52. For example, the same material as the material for forming the first electrode (Txa) 522 can be used as a material for forming the pixel electrode 52. For example, a polyimide resin can be used as a material for forming the first oriented film 50.

It is possible to manufacture a so-called TFT array side substrate using the manufacturing method explained above.

Next, a manufacturing method of an opposing side substrate is explained. The opposing side substrate has an opposing substrate 90, a color filter layer 80, a second oriented film 70, a first touch electrode layer 100 and a substrate 110. The second oriented film 70 is applied after forming the color filter layer 80 on the opposing substrate 90. For example, a polyimide resin can be used as a material for forming the second oriented film 70. In addition, the order of formation of the color filter layer 80 may be appropriately selected. For example, a red color filter layer may be formed, a green color filter layer may be formed, and then a blue color filter layer may be formed. The color filter layer may be formed on the entire surface by coating and then formed by a photolithography technique. Furthermore, the method of forming the color filter layer is not limited to this method. The first touch electrode layer 100 is formed from a first electrode (Txa) 529 and a second electrode (Txb) 528 which form a second touch electrode 527, a third electrode (Rx) 524A, a third electrode Rx) 524B, and an insulating film covering each electrode. A first electrode (Txa) 529 and a second electrode (Txb) 528 which form the second touch electrode 527, a third electrode (Rx) 524A and a third electrode (Rx) 524B are arranged on a surface on the opposite side to a surface where the color filter layer 80 is arranged in the opposing substrate 90. The material for forming the insulating film may be an organic resin or a material containing an adhesive. For example, it is possible to use a similar material as the planarization film 31 as a material for forming the insulating film. In addition, the first electrode (Txa) 529 and the second electrode (Txb) 528 which form the second touch electrode 527, the third electrode (Rx) 524A and the third electrode (Rx) 524B can be formed using the material for forming first the electrode (Txa) 522 and the second electrode (Txb) 520. Furthermore, by arranging the substrate 110 on the insulating film, it is possible to prevent damage to the display panel, particularly to the touch electrode layer. The first electrode (Txa) 529 and the second electrode (Txb) 528 are utilized together with the third electrode (Rx) 524A as a mutual capacitive type proximity sensor. Therefore, by using the first electrode (Txa) 529, the second electrode (Txb) 528, and the third electrode (Rx) 524A, it is possible to perform detection when holding a hand (over an electrode).

In the example of the manufacturing method of the display device according to one embodiment of the present invention shown in FIG. 9, the color filter layer 80 is formed directly above the opposing substrate 90. The color filter layer 80 may not be formed directly above the opposing substrate 90, and an insulating film may be formed above the opposing substrate 90. By forming this insulating film, the surface of the opposing substrate 90 can be planarized. Therefore, since it is possible to planarize the color filter layer 80 formed above the insulating film, it is possible to suppress color mixing between adjacent pixels. In addition, a layer may be formed with a light shielding film above the opposing substrate 90 or between the color filter layer 80 and the second oriented film 70. The layer on which the light shielding film is formed has the role of shielding visible light and it is also possible to suppress color mixing between adjacent pixels.

An opposing side substrate can be manufactured using the manufacturing method described above.

Finally, the liquid crystal layer 60 is sandwiched between a substrate on the side of the TFT array and a substrate on the opposing side using, for example, a sealing material or the like, and bonded. Furthermore, a polarization plate may be bonded to one or both of the substrate 20 and the opposing substrate 90. In this way, the display panel 500 can be manufactured.

Figure 10:
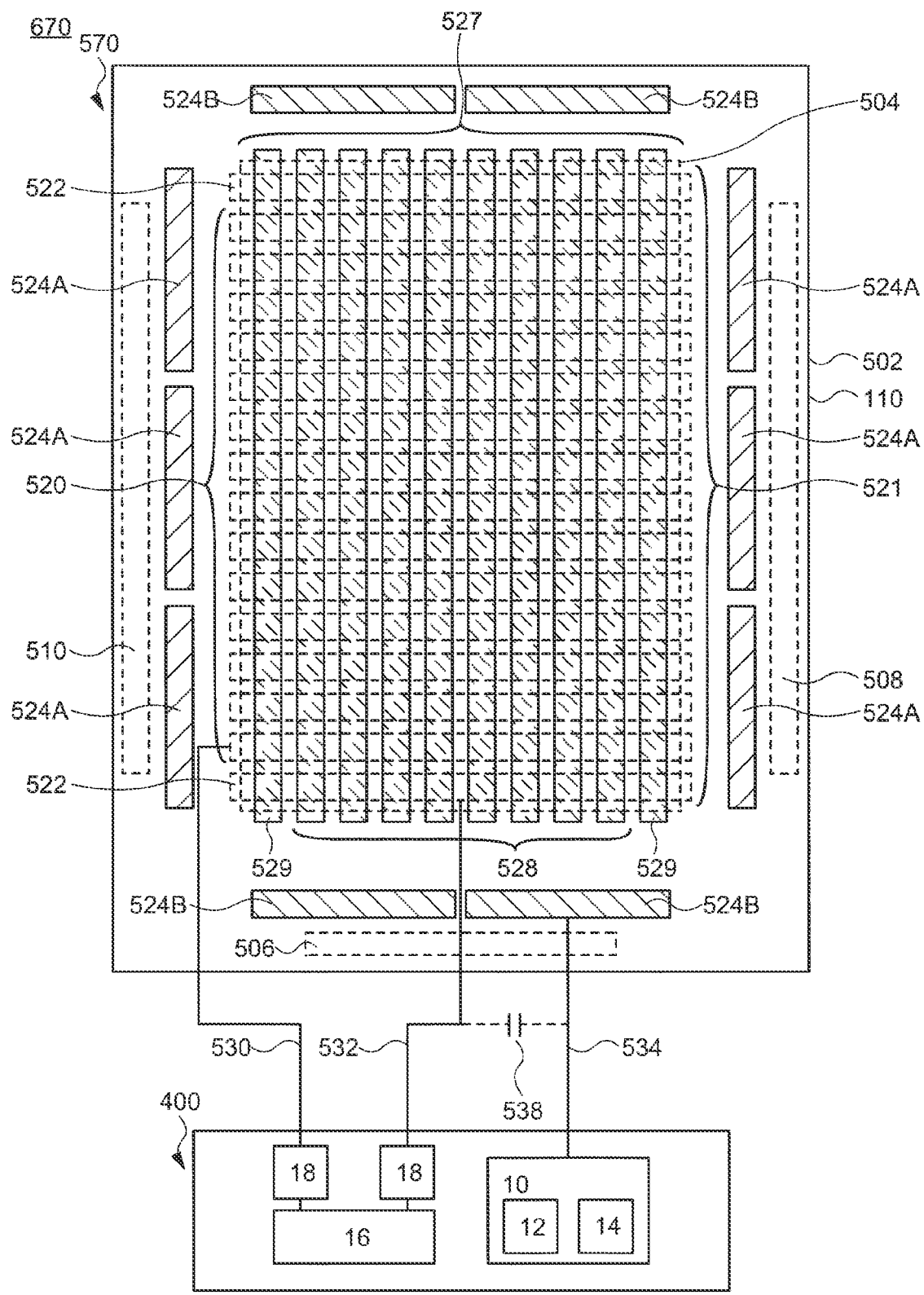
FIG. 10 is a schematic planar diagram showing a structure of a proximity sensor and a display device related to one embodiment of the present invention.
Figure 11:
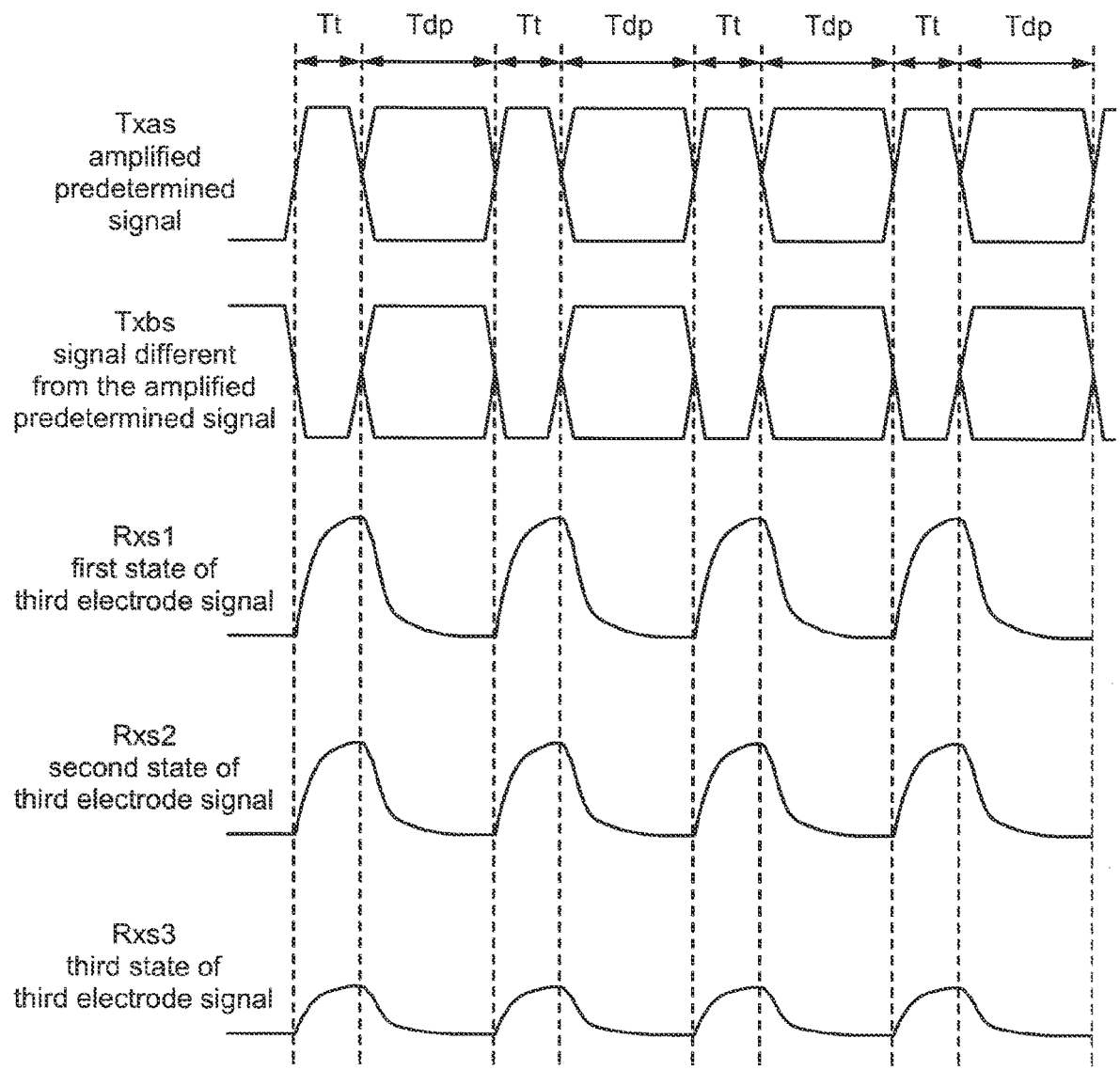
FIG. 11 is a timing chart for explaining touch detection of a proximity sensor and a display device related to one embodiment of the present invention.

FIG. 10 is a schematic planar diagram showing a structure of a proximity sensor and a display device according to one embodiment of the present invention. Compared to FIG. 1, the details of the circuit substrate 400 and clarification of an electrical connection between the circuit substrate 400 and each electrode are different. In FIG. 10, the same contents as in FIG. 1 are omitted from the explanation here. FIG. 11 is a timing chart for explaining touch detection of a proximity sensor and the display device according to one embodiment of the present invention. Touch detection is explained using FIG. 10 and FIG. 11. Furthermore, in order to promote understanding, the circuit substrate 410, the connector 512, the connector 513 and the connector 514 are omitted from the diagrams. In addition, a path where the wirings 530, 532, and 534 are electrically connected to the second connection wiring 310 formed on the opposing substrate 90, the connector 513, the circuit substrate 410, the connector 514, and the circuit substrate 400 is shown as one wiring for the purpose of promoting understanding.

The circuit substrate 400 includes an amplifier circuit 18. The amplifier circuit 18 is electrically connected to the timing generation circuit part 16. One of the amplifying circuits 18 is electrically connected to the first electrode (Txa) 522, and another amplifying circuit 18 is electrically connected to the second electrode (Txb) 520. At the time of touch detection, a predetermined signal is input from the timing generation circuit part 16 to one of the amplification circuits 18. In addition, the amplified predetermined signal (Txas) is output from one amplifier circuit 18 via the wiring 532 and input to the first electrode (Txa) 522. In addition, at the time of touch detection, a signal different from the predetermined signal is input from the timing generation circuit part 16 to the other amplifier circuit 18. In addition, a signal (Txbs) which is different from the amplified predetermined signal is output from the other amplifier circuit 18 via the wiring 530 and input to the second electrode (Txb) 520. Furthermore, a signal different from the predetermined signal may have a different phase from the predetermined signal. Specifically, the phase of the signal which is different from the predetermined signal may be the reverse of the phase of the predetermined signal. When the display device 670 is not touched, a first state of a signal of the third electrode (Rxs1) as shown in FIG. 11 is detected in the third electrode (Rx) 524B via the wiring 534. Next, when a finger touches in proximity of the display device 670, for example, the capacitance value of a parasitic capacitor 538 changes via the second electrode (Txb) 520 and the third electrode (Rx) 524B, and a second state of a signal of the third electrode (Rxs2) as shown in FIG. 11 is detected in the third electrode (Rx) 524B. Rxs2 has a smaller voltage amplitude compared to Rxs1. Next, when a hand is held in proximity to the display device 670, for example, a third state of a signal of the third electrode (Rxs3) as shown in FIG. 11 is detected in the third electrode (Rx) 524B via the first electrode (Txa) 522 and the third electrode (Rx). Rxs3 has a smaller voltage amplitude compared with Rxs2. Furthermore, the voltage amplitude of a predetermined signal and the voltage amplitude of a signal different from a predetermined signal may be appropriately selected within a range which does not depart from the structure according to the present invention. For example, the voltage amplitude of each signal may be 8V or 10V. For example, the detected signal Rxs1 may be amplified by a calculation amplifier circuit 12 included in the signal detection circuit part 10. By amplifying the detected signal Rxs1 using the calculation amplifier circuit 12, the waveform of the signal is clarified and detection sensitivity is improved. Furthermore, the detected signal Rxs1 may be converted into a digital signal by an AD conversion circuit 14 after being amplified by the calculation amplifier circuit 12. By converting the detected signal Rxs1 from an analog signal to a digital signal, since a digital signal does not deteriorate in the same way as an analog signal, it is possible to perform signal processing stably.

As is shown in FIG. 10, the area of the second electrode (Txb) 520 is larger than the area of the first electrode (Txa) 522. The area of the first electrode (Txa) 522 is smaller than the area of the second electrode (Txb) 520.

In FIG. 11, Tt is a time period of touch detection. In addition, Tdp is a time period during which an image signal is input to the display device 600 and image data is written to the display panel 500. In Tdp, the amplified predetermined signal (Txas) and the signal (Txbs) different from the amplified predetermined signal are applied with a common constant voltage. For example, a common voltage of 0V is applied.

In the proximity sensor and the display device according to one embodiment of the present invention, the first electrode (Txa), the second electrode (Txb), and the third electrode (Rx) are used as mutual capacitance type proximity sensors. Therefore, even when the detection target, the proximity sensor and the display device are in a non-contact state, a hand receives an electric field of the first electrode (Txa), and a predetermined signal is transmitted to the third electrode (Rx) via a capacitance which is formed by a hand with the first electrode (Txa), and a capacitance formed by the third electrode (Rx) with a hand. Therefore, by using the proximity sensor and the display device according to one embodiment of the present invention, it is possible to detect the position where the hand is held over. In addition, since a waveform of the touch detection becomes clear by including the proximity sensor and the display device according to one embodiment of the present invention with a calculation amplifier circuit, it is possible to realize highly accurate touch detection.

Second Embodiment

In the present embodiment, a timing chart of the proximity sensor and the display device according to one embodiment of the present invention is explained. Furthermore, an explanation of the same structure as in the first embodiment may be omitted.

Figure 12:
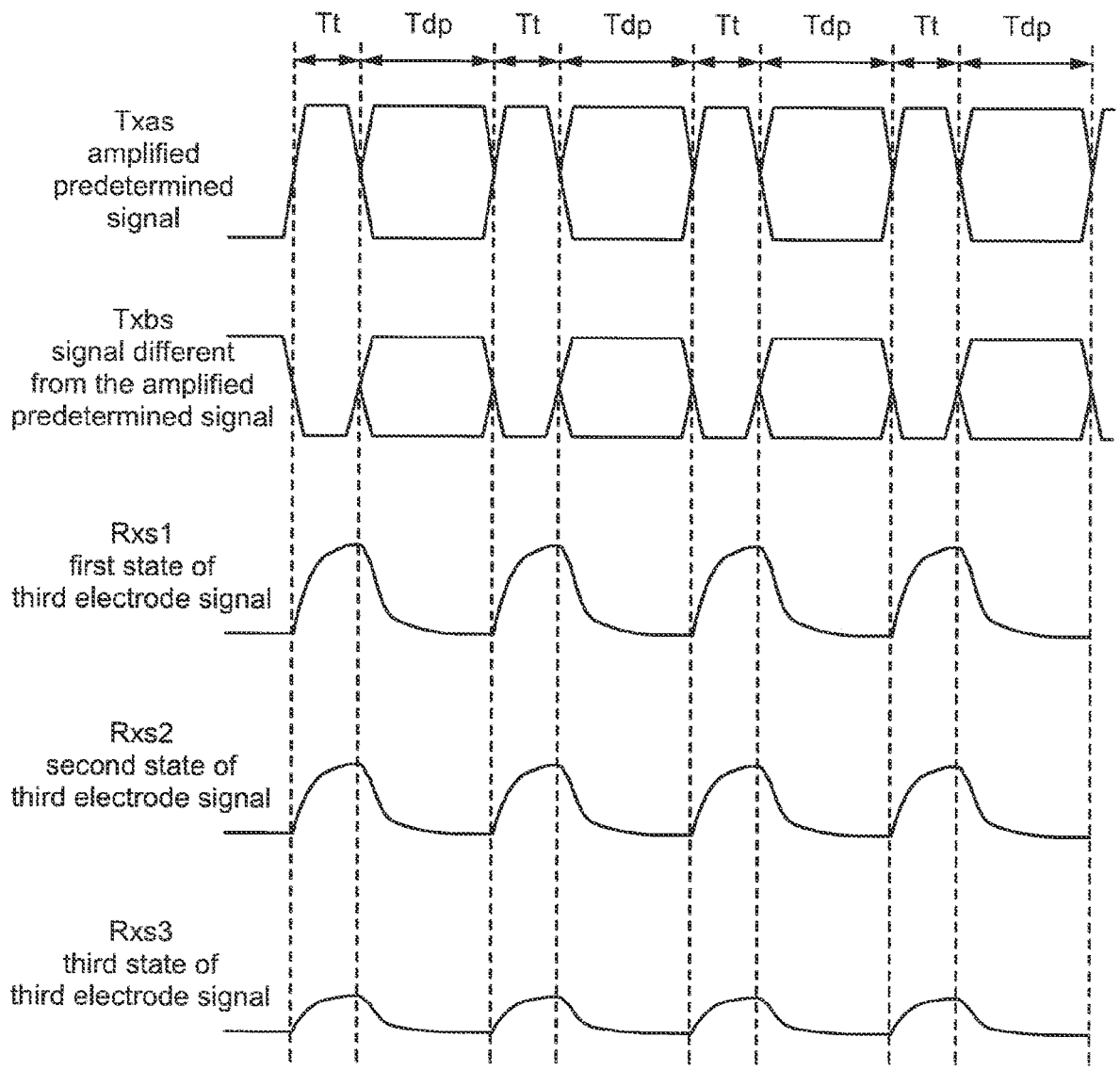
FIG. 12 is a timing chart for explaining touch detection of a proximity sensor and a display device related to one embodiment of the present invention.

FIG. 12 is a timing chart for explaining the touch detection of the proximity sensor and the display device according to one embodiment of the present invention. Although an example in which the voltage amplitude between the predetermined signal (Txas) and the signal (Txbs) which is different from the predetermined signal is the same is shown in FIG. 11, in FIG. 12 an example is shown in which the voltage amplitude between the predetermined signal (Txas) and a signal (Txbs) which is different from the predetermined signal are different. Apart from this, the remainder is the same as in FIG. 11, and therefore an explanation is omitted here.

Figure 13:
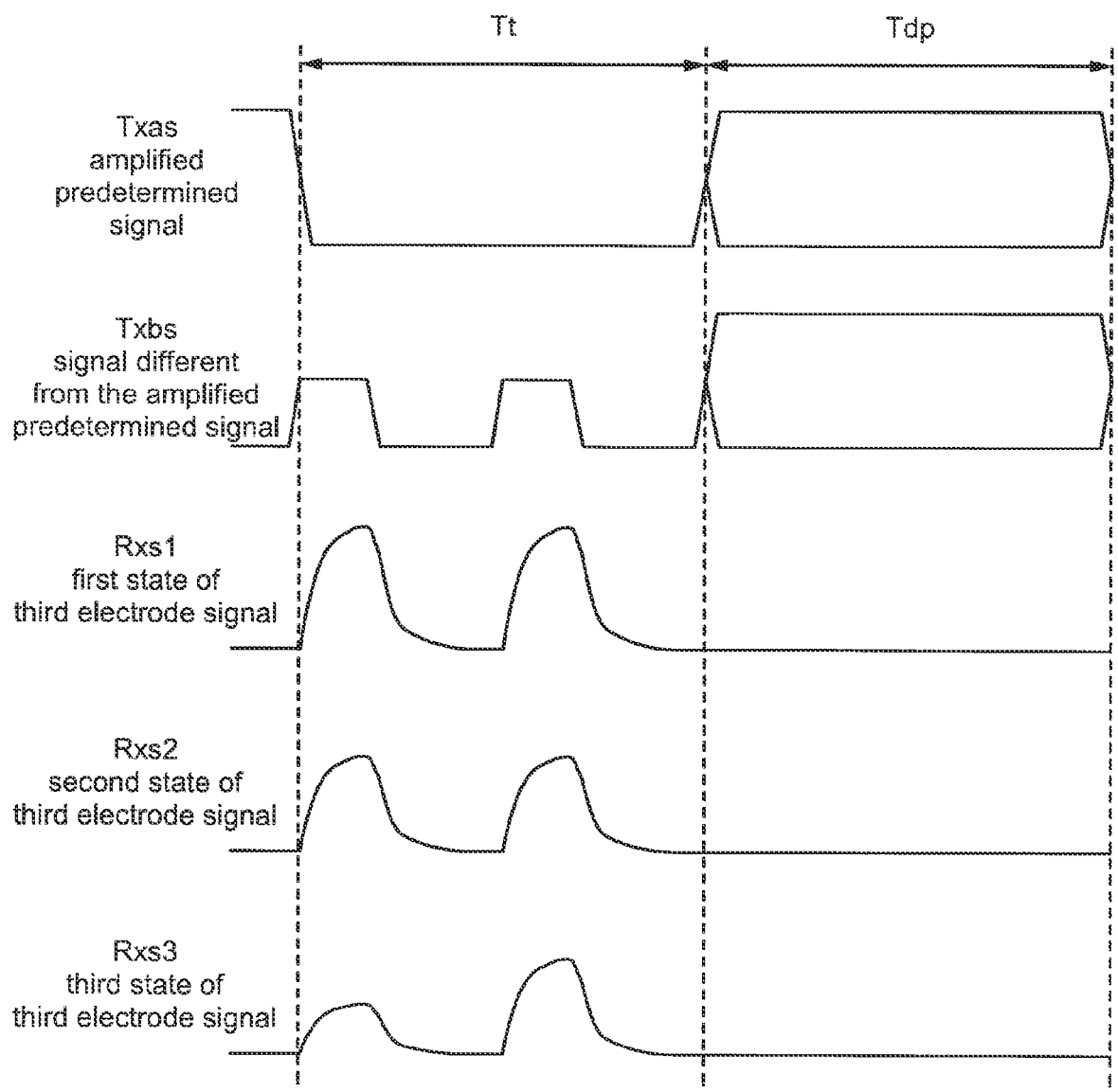
FIG. 13 is a timing chart for explaining touch detection of a proximity sensor and a display device related to one embodiment of the present invention.

FIG. 13 is a timing chart for explaining touch detection of the proximity sensor and the display device according to one embodiment of the present invention. FIG. 13 shows an example in which a pulse width is different between the predetermined signal (Txas) and the signal (Txbs) which is different from the predetermined signal. For example, in the case when Tt is a unit of time, the predetermined signal (Txas) corresponds to one cycle, whereas the signal (Txbs) which is different from the predetermined signal has two cycles. In addition, FIG. 13 shows an example in which a pulse width is different and a voltage amplitude is different between the predetermined signal (Txas) and the signal (Txbs) which is different from the predetermined signal. Apart from this the remainder is the same as in FIG. 11, and therefore an explanation is omitted here.

Figure 14:
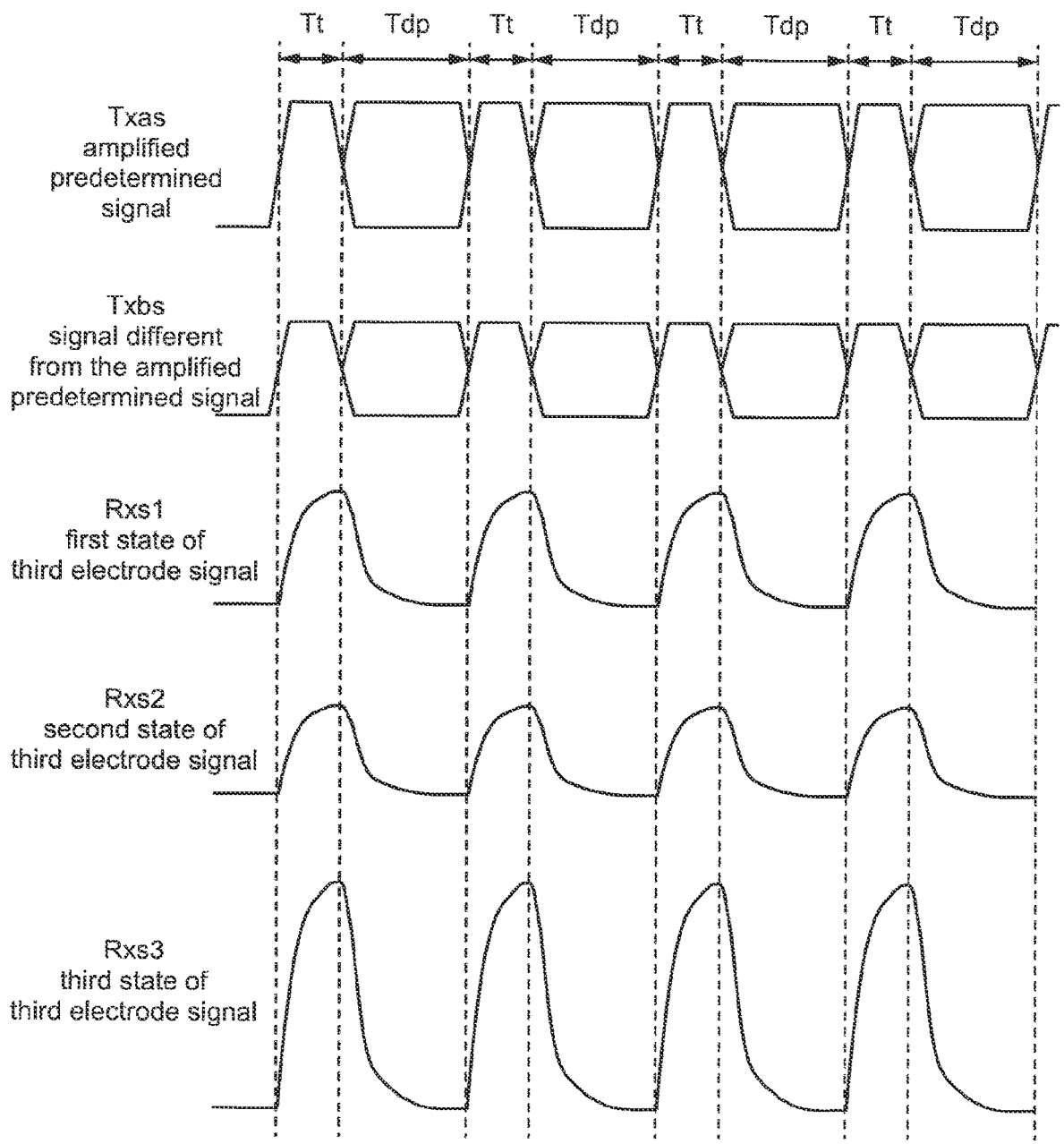
FIG. 14 is a timing chart for explaining touch detection of a proximity sensor and a display device related to one embodiment of the present invention.

FIG. 14 is a timing chart for explaining touch detection of the proximity sensor and the display device according to one embodiment of the present invention. An example is shown in FIG. 14 in which the predetermined signal (Txas) and the predetermined signal (Txbs) have the same phase. In addition, in FIG. 14, an example is shown in which the predetermined signal (Txas) and the predetermined signal (Txbs) have the same phase and the voltage amplitude of the predetermined signal (Txbs) is smaller than the voltage amplitude of the predetermined signal (Txas). Apart from this the remainder is the same as in FIG. 11, and therefore an explanation is omitted here. Furthermore, in the case when the predetermined signal (Txas) and the predetermined signal (Txbs) have the same phase, the area of the second electrode (Txb) 520 is larger than the area of the first electrode (Txa) 522. Alternatively, the area of the first electrode (Txa) 522 is smaller than the area of the second electrode (Txb) 520.

Figure 15:
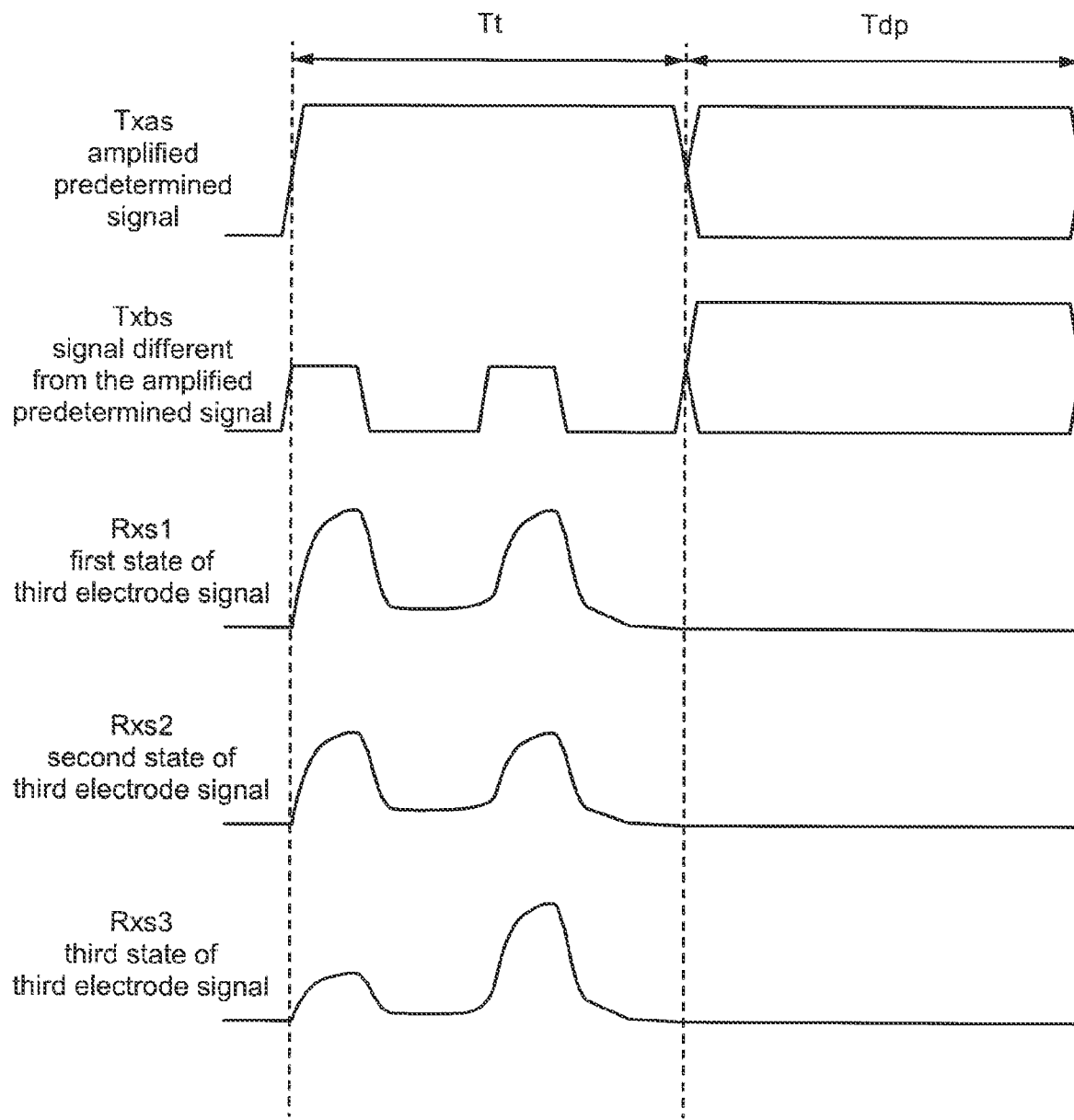
FIG. 15 is a timing chart for explaining touch detection of a proximity sensor and a display device related to one embodiment of the present invention.

FIG. 15 is a timing chart for explaining touch detection of the proximity sensor and the display device according to one embodiment of the present invention. In FIG. 15, an example is shown in which the predetermined signal (Txas) and the signal (Txbs) which is different from the predetermined signal have different pulse widths. For example, in the case when Tt is a unit of time, the predetermined signal (Txas) corresponds to one cycle, whereas the signal (Txbs) which is different from the predetermined signal has two cycles. In addition, an example is shown in FIG. 15 in which the predetermined signal (Txas) and the signal (Txbs) which is different from the predetermined signal have different pulse widths and different voltage amplitudes. Apart from this the remainder is the same as in FIG. 11, and therefore an explanation is omitted here. Furthermore, in the case when the predetermined signal (Txas) and the signal (Txbs) which is different from the predetermined signal have the same phase, the area of the second electrode (Txb) 520 is larger than the area of the first electrode (Txa) 522. Alternatively, the area of the first electrode (Txa) 522 is preferred to be smaller than the area of the second electrode (Txb) 520.

In the proximity sensor and the display device according to one embodiment of the present invention, the first electrode (Txa), the second electrode (Txb) and the third electrode (Rx) are used as mutual capacitance type proximity sensors. Therefore, even when the detection target, the proximity sensor and the display device are in a non-contact state, a predetermined signal is transmitted to the third electrode (Rx) via a capacitance formed by the second electrode (Txb) and a hand, and a capacitance formed by a hand and the third electrode (Rx). In addition, even if the detection object, the proximity sensor and the display device are in a non-contact state, even if the voltage amplitude of a signal which is input to the second electrode (Txb) is smaller than the voltage amplitude of a signal input to the first electrode (Txa), it is possible to transmit a predetermined signal to the third electrode (Rx) via a capacitance formed by the second electrode (Txb) and a hand, and a capacitance formed by a hand and the third electrode (Rx). Therefore, by using the proximity sensor and the display device according to one embodiment of the present invention, it is possible to detect the position where the hand is held over. In addition, since the voltage amplitude of a signal which is input to the second electrode (Txb) is smaller than the voltage amplitude of a signal which is input to the first electrode (Txa), the voltage amplitude of a signal transmitted to the third electrode (Rx) has a relatively large intensity. By using the proximity sensor and the display device according to one embodiment of the present invention, it is possible to provide a proximity sensor and a display device which are resistant to noise and have high touch detection accuracy.

In the proximity sensor and the display device according to one embodiment of the present invention, the first electrode (Txa), the second electrode (Txb) and the third electrode (Rx) are used as mutual capacitance type proximity sensors. Therefore, even when the detection target, the proximity sensor and the display device are in a non-contact state, a predetermined signal is transmitted to the third electrode (Rx) via the capacitance formed by the second electrode (Txb) and a hand, and a capacitance formed by a hand and the third electrode (Rx). In addition, even when the detection object, the proximity sensor and the display device are in a non-contact state and the pulse width of a signal which is input to the first electrode (Txa) and the pulse width of a signal which is input to the second electrode (Txb) are different, a predetermined signal is transmitted to the third electrode (Rx) via the capacitance formed by the second electrode (Txb) and a hand, and a capacitance formed by a hand and the third electrode (Rx). Therefore, by using the proximity sensor and the display device according to one embodiment of the present invention, it is possible to detect a position where the hand is held over. In addition, since the pulse width of a signal which is input to the first electrode (Txa) is different to the pulse width of a signal which is input to the second electrode (Txb), it is possible to improve output sensitivity by utilizing the time direction. By using the proximity sensor and the display device according to one embodiment of the present invention, even when the voltage amplitude of each signal is small, it is possible to detect the position where the hand is held over, that is, it is possible to detect the position of the touch.

In the proximity sensor and the display device according to one embodiment of the present invention, the first electrode (Txa), the second electrode (Txb) and the third electrode (Rx) are used as mutual capacitance type proximity sensors. Therefore, even when the detection target, the proximity sensor and the display device are in a non-contact state, by making the area of the second electrode (Txb) larger than the area of the first electrode (Txa), even if the phase of a signal which is input to the first electrode (Txa) and the phase of a signal which is input to the second electrode (Txb) are the same phase, it is possible for a predetermined signal to be transmitted to the third electrode (Rx) via a capacitance formed by the second electrode (Txb) and a hand, and a capacitance formed by a hand and the third electrode (Rx). Therefore, by using the proximity sensor and the display device according to on embodiment of the present invention, it is possible to detect the position where the hand is held over. In addition, since the phase of the signal which s input to the first electrode (Txa) and the phase of the signal which is input to the second electrode (Txb) are the same phase, it is not necessary for a timing generation circuit unit to generate signals having different phases. Therefore, in the proximity sensor and the display device according to one embodiment of the present invention, it is possible to reduce the circuit scale of the timing generation circuit part.

In the proximity sensor and the display device according to one embodiment of the present invention, the first electrode (Txa), the second electrode (Txb), and the third electrode (Rx) are used as mutual capacitance type proximity sensors. Therefore, even when the detection target, the proximity sensor and the display device are in a non-contact state, by making the area of the second electrode (Txb) larger than the area of the first electrode (Txa), the phase of the signal which is input to the first electrode (Txa) and the phase of the signal which is input to the second electrode (Txb) are the same, and when the pulse width of the signal which is input to the first electrode (Txa) and the pulse width of the signal which his input to the second electrode (Txb) are different, it is possible to improve the output sensitivity by utilizing time direction. Therefore, by using the proximity sensor and the display device according to one embodiment of the present invention, even if the voltage amplitude of each signal is small, it is possible to detect the position where a hand is held over.

Third Embodiment

In the present embodiment, another structure of the proximity sensor and the display device according to one embodiment of the present invention is explained. Furthermore, explanations of structures which are similar to those of the first embodiment or the second embodiment may be omitted.

Figure 16:
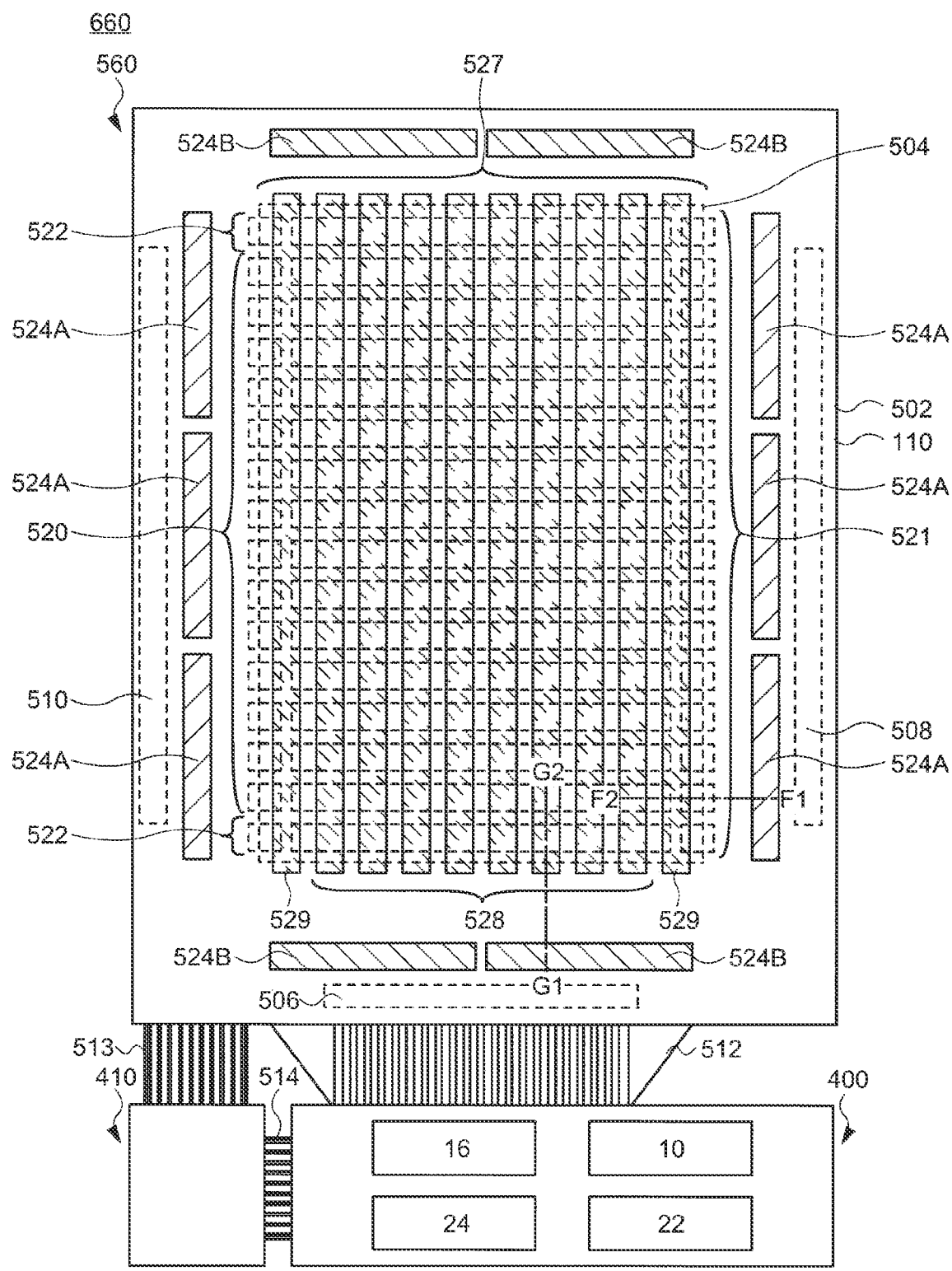
FIG. 16 is a schematic planar diagram showing a structure of a proximity sensor and a display device related to one embodiment of the present invention.
Figure 17:
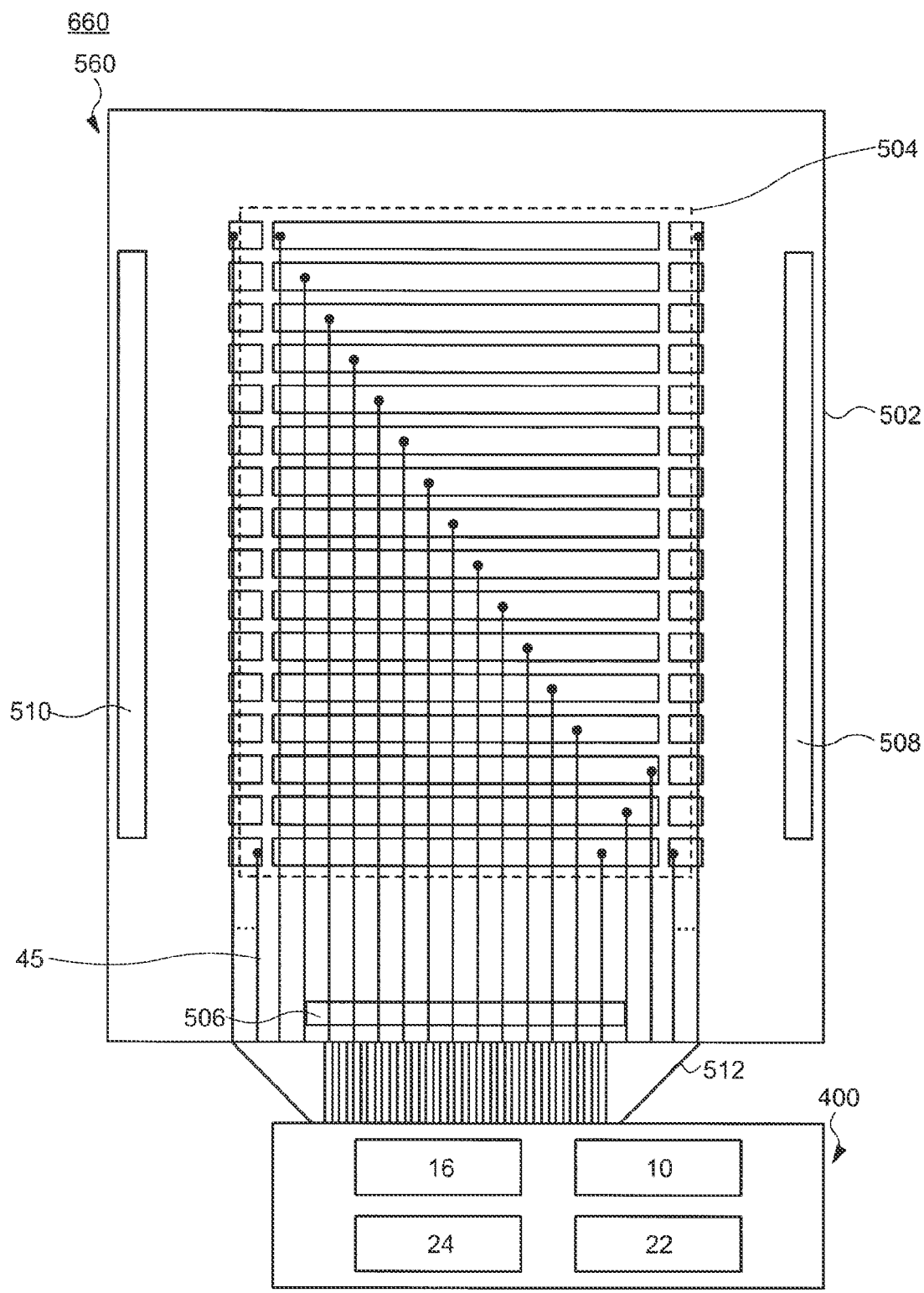
FIG. 17 is a schematic planar diagram showing a structure of a proximity sensor and a display device related to one embodiment of the present invention.
Figure 18:
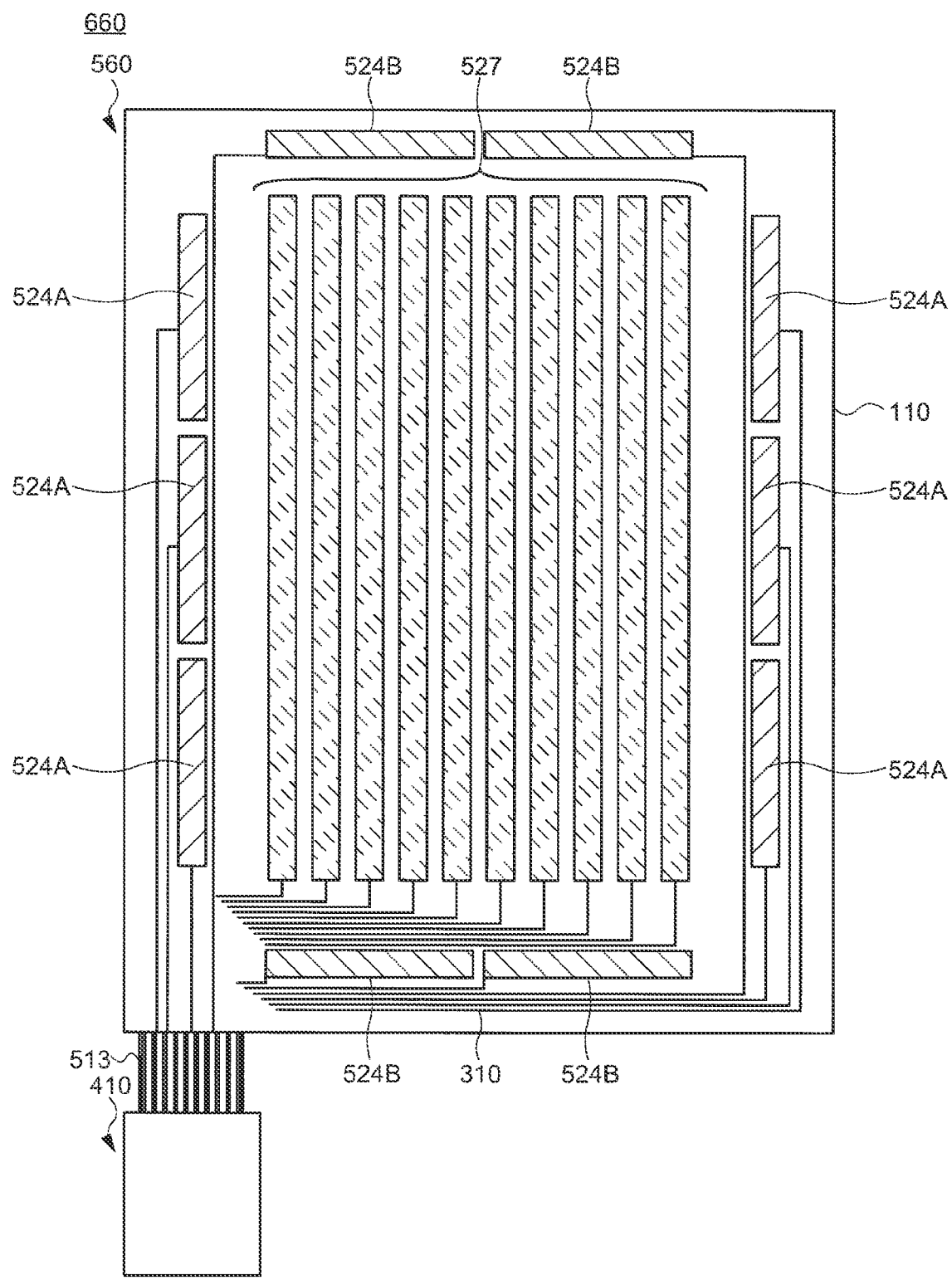
FIG. 18 is a schematic planar diagram showing a structure of a proximity sensor and a display device related to one embodiment of the present invention.

FIG. 16, FIG. 17 and FIG. 18 are schematic planar diagrams showing other structures of the proximity sensor and the display device according to one embodiment of the present invention.

FIG. 16 is different from the structure of FIG. 1 in that the plurality of first touch electrodes 521 are different in that each individual first touch electrode is formed from three electrodes. Apart from this, FIG. 16 is the same as FIG. 1, and an explanation similar to FIG. 1 is omitted here.

FIG. 17 is different from the structure of FIG. 2 in that the plurality of first touch electrodes 521 are different in that each individual first touch electrode is formed from three electrodes. Apart from this, FIG. 17 is the same as FIG. 2, and an explanation similar to FIG. 2 is omitted here.

Since FIG. 18 is the same as FIG. 3, an explanation is omitted here.

Figure 19:
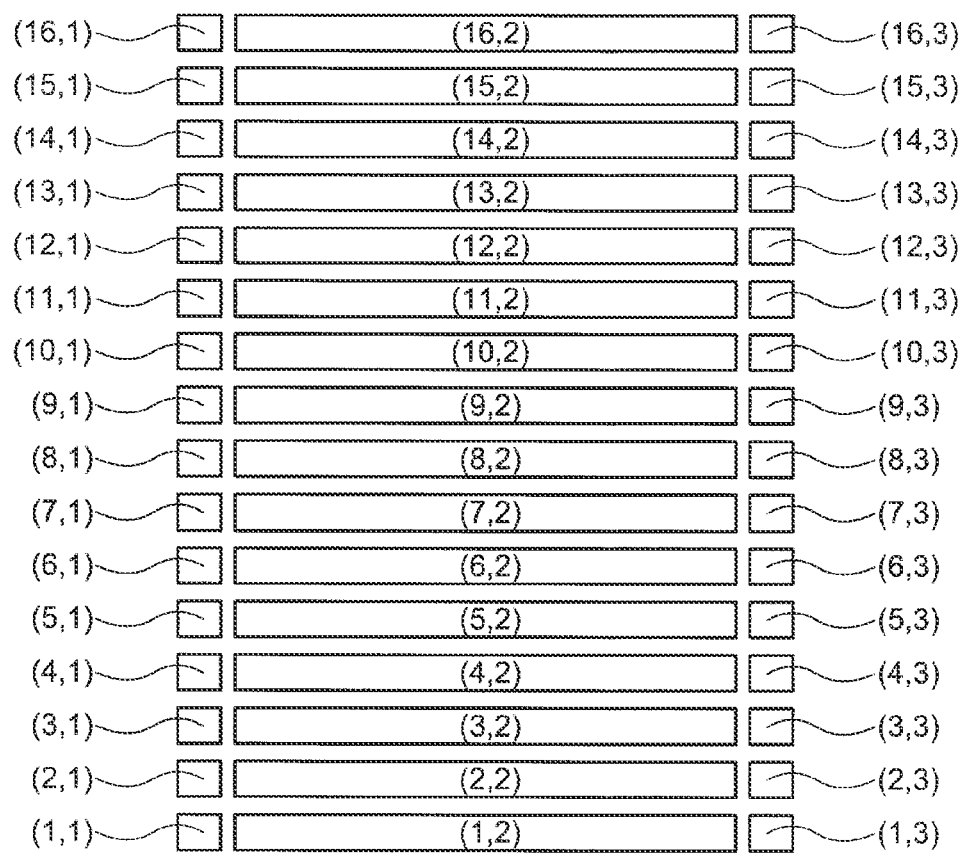
FIG. 19 is a diagram for explaining a structure of a proximity sensor and a display device related to one embodiment of the present invention.

FIG. 19 shows that in each of the plurality of first touch electrodes 521, each individual first touch electrode is formed from three electrodes. In order to promote understanding, an example is explained in which the number of the plurality of first touch electrodes 521 is sixteen in the proximity sensor and the display device according to one embodiment of the present invention. In FIG. 19, sixteen first touch electrodes appear as a row and three electrodes appear as one to three columns of electrodes, each electrode is indicated by n rows and m columns, and the coordinates of each electrode are expressed by (n, m). For example, the electrodes of nine rows and two columns located approximately at the center of FIG. 19 are shown by the coordinates (9, 2). By using the first connection wiring 45 in the proximity sensor and the display device according to one embodiment of the present invention, since a signal can be independently applied to each of the divided touch electrodes respectively, it is possible to improve the accuracy of the position of the touch detection.

For example, the first connection wiring 45 which is connected to each electrode at (1, 1), an electrode at (1, 2) and an electrode at (1, 3) are electrically connected to each other outside the connector 512. The plurality of first touch electrodes 521 shown in FIG. 1 are formed by electrically connecting the electrodes of each row in the same way. Furthermore, by arranging a switch between the first connection wiring 45 and the connector 512 in the method of electrically connecting the first connection wiring 45 outside the connector 512, the conduction or non-conduction of each wiring is controlled. In addition, a switch is formed at the same time as forming a transistor on the substrate 502, and the formed switch may be controlled by a control circuit (not shown in the diagram). The control circuit may be formed on the substrate 502 or may be formed outside the connector 512. In addition, the switch may be controlled by a control signal generated by the control circuit.

Figure 20:
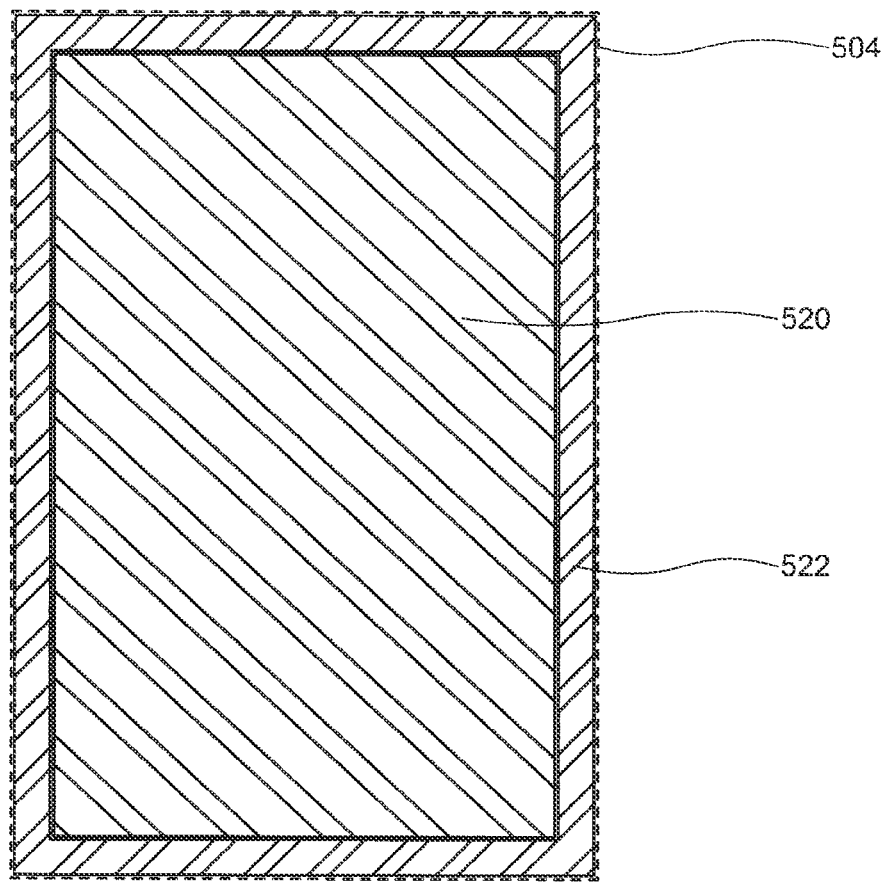
FIG. 20 is a diagram for explaining a structure of a proximity sensor and a display device related to one embodiment of the present invention.

Another example that can be exemplified is to increase the area of the electrode. Electrodes from row 2 to 15 shown in FIG. 19 are electrically connected to form a second electrode (Txb) 520 having a large area. All of the electrodes in the first row, all the electrodes in the third row, the electrode in the first row second column, and the electrode in the sixteenth row second column are electrically connected to each other to form a first electrode (Txa) 522 having a large area. Specifically, a display device is provided which has a structure in which a first electrode (Txa) 522 surrounds a second electrode (Txb) 520 as shown in FIG. 20. By making the area of the second electrode (Txb) 520 larger than the area of the first electrode (Txa) 522, it is possible to improve detection sensitivity of a signal transmitted to the third electrode (Rx). Therefore, it is possible to provide a display device with touch detection having high sensitivity.

Figure 21:
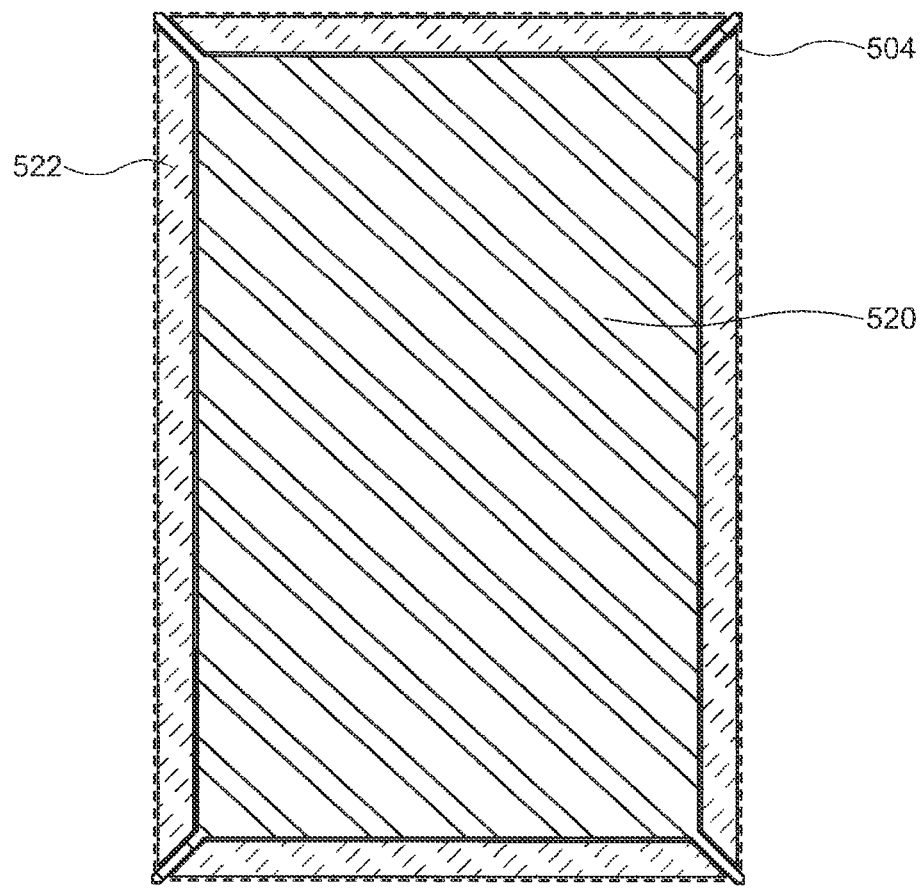
FIG. 21 is a diagram for explaining a structure of a proximity sensor and a display device related to one embodiment of the present invention.

As yet another example, the electrode from row 2 to row 15 shown in FIG. 19, the electrode in the first row first column, the electrode in the first row third column, the electrode in the sixteenth row first column, and the electrode in the sixteenth row third column are electrically connected to form a second electrode (Txb) 520 having a large area. Electrodes from the second row of the first column to the fifteenth row are electrically connected to form a first electrode (Txa) 522 on the left side of the display device in the case when a surface on which an image of the display device is displayed is on top. Electrodes from the second row of the third column to the fifteenth row are electrically connected to form a first electrode (Txa) 522 on the right side of the display device in the case when a surface on which an image of the display device is displayed is on top. A first electrode (Txa) 522 on the lower side of the display device in the case where the surface on which an image of the display device is displayed is on top is formed by an electrode on row one column two. A first electrode (Txa) 522 on the upper side of the display device in the case when the surface on which an image of the display device is displayed is on top is formed by an electrode on row sixteen column two. Specifically, the display device as is shown in FIG. 21 is provided. By providing the first electrode (Txa) 522 on the top and lower and left and right sides of the display device in the case when the surface on which an image of the display device is displayed is on top, it is possible to provide a display device with high sensitivity of detection when a hand is held up, down, left, right or in an oblique direction.

Figure 22:
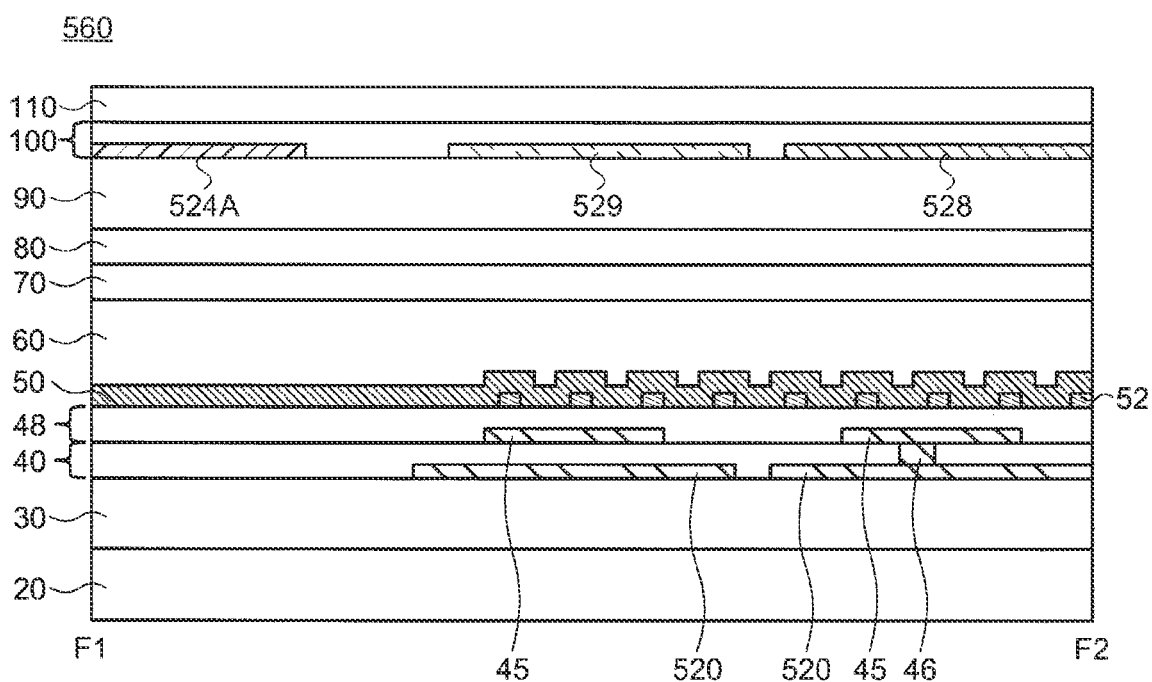
FIG. 22 is a schematic cross-sectional diagram showing a structure of a proximity sensor and a display device related to one embodiment of the present invention.
Figure 23:
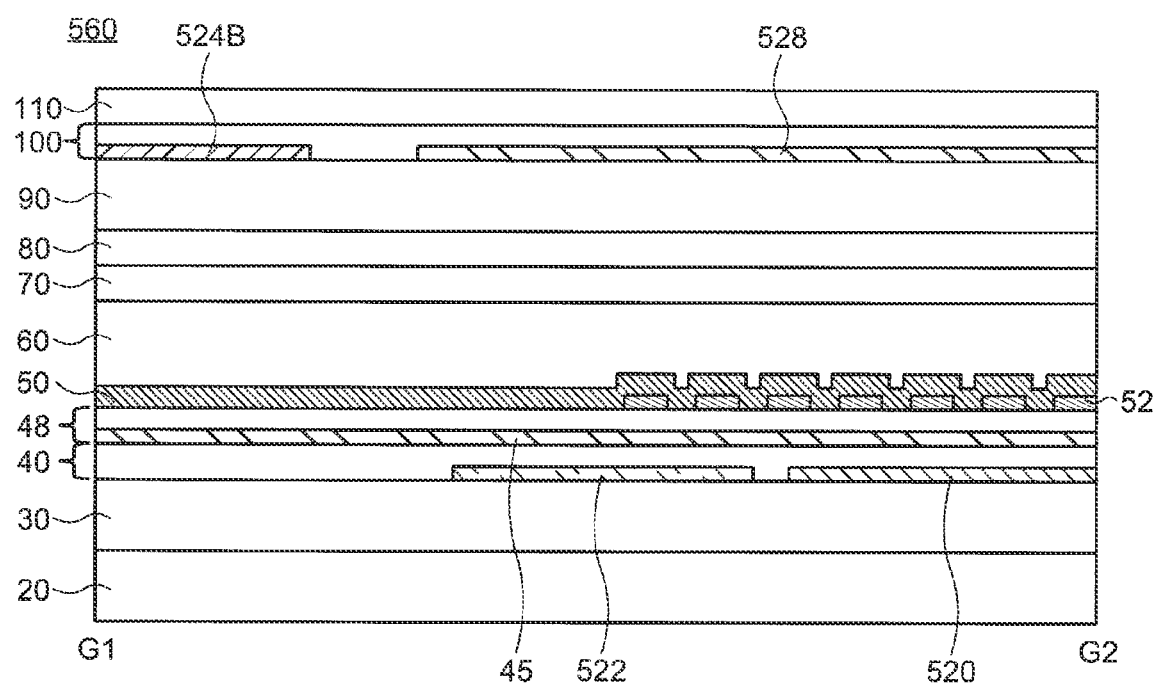
FIG. 23 is a schematic cross-sectional diagram showing a structure of a proximity sensor and a display device related to one embodiment of the present invention.

FIG. 22 and FIG. 23 are schematic cross-sectional diagrams showing a structure of a proximity sensor and a display device according to one embodiment of the present invention. FIG. 22 shows a cross-section of a region shown by F1 and F2 shown in FIG. 16. FIG. 23 shows a cross-section of a region shown by G1 and G2 shown in FIG. 16.

FIG. 22 is different from the structure in FIG. 4 in that the first touch electrode 521 is divided. Apart from this, FIG. 22 is the same as FIG. 4, and an explanation thereof is omitted.

FIG. 23 is the same as the structure in FIG. 5 and an explanation thereof is omitted.

Figure 24:
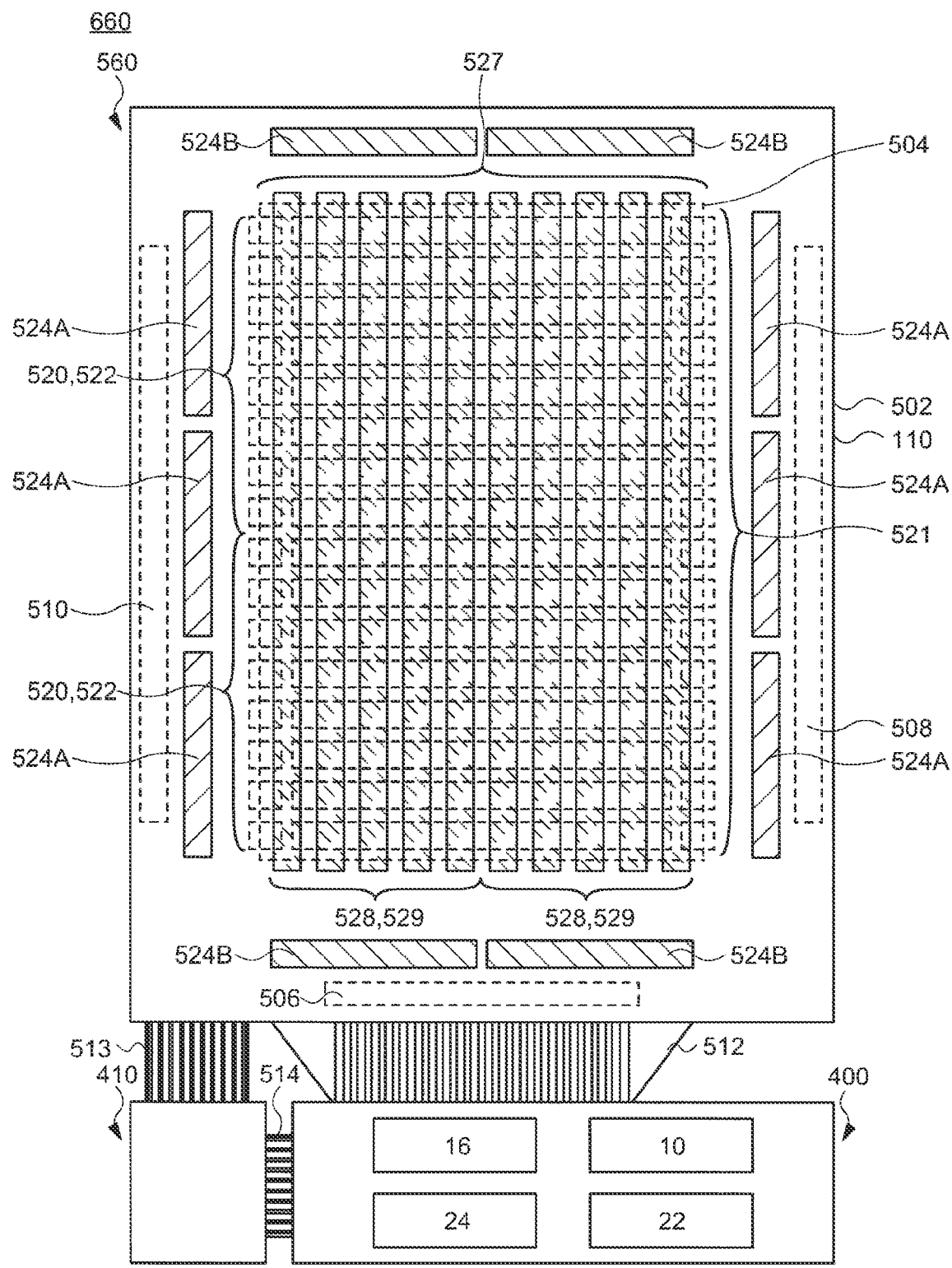
FIG. 24 is a schematic planar diagram showing a structure of a proximity sensor and a display device related to one embodiment of the present invention.

FIG. 24 is a schematic planar diagram showing yet another structure of the proximity sensor and the display device according to one embodiment of the present invention. Furthermore, the cross-section in FIG. 24 is the same as in FIG. 22 and FIG. 23 and an explanation here is omitted.

The structure in FIG. 24 is explained using FIG. 19. In FIG. 19, electrodes from row one to row eight are electrically connected to form one of the first electrode (Txa) 522 or the second electrode (Txb) 520. Electrodes from row nine to row sixteen are electrically connected to form the other of the first electrode (Txa) 522 or the second electrode (Txb) 520. In this way, it is possible to provide the display device 660 in which the area of the first electrode (Txa) 522 and the area of second electrode (Txb) 520 are approximately equal.

In FIG. 24, non-contact type sensing can use the timing chart shown in FIG. 11 for example. That is, when a hand is held over the display panel 560, for example, a predetermined signal is input to half the number of first electrodes (Txa) 522 of the number of the plurality of first touch electrodes 521, and a signal which has a different phase from the predetermined signal is input to the remaining half of the second electrodes (Txb). The hand receives an electric field of the second electrode (Txb) 520, and a predetermined signal is transmitted to the third electrode (Rx) 524B via a capacitance formed by the second electrode (Txb) 520 and the hand, and a capacitance formed by the hand and the third electrode (Rx) 524B.

When the detection target, the proximity sensor and the display device are in a non-contact state, even in the case when the area of the first electrode (Txa) 522 is equal to the area of the second electrode (Txb) 520, by using the first electrode (Txa) 522, the second electrode (Txb) 520 and the third electrode (Rx) 524 as mutual capacitance type proximity sensors, it is possible to detect the position where the hand is held over. Furthermore, in the case when the first electrode (Txa) 522 and the second electrode (Txb) 520 are used for touch detection, the third electrode (Rx) 524B is used and the third electrode (Rx) 524A is not used.

Similarly, a predetermined signal is input to half the number of first electrodes (Txa) 529 of the plurality of second touch electrodes 527 and a signal which has a different phase to the predetermined signal is input to the remaining half of the second electrodes (Txb) 528. The hand receives an electric field of the second electrode (Txb) 528, and a predetermined signal is transmitted to the third electrode (Rx) 524A via a capacitance formed by the second electrode (Txb) 528 and a hand, and a capacitance formed by the hand and the third electrode (Rx) 524A.

When the detection target, the proximity sensor and the display device are in a non-contact state, even in the case when the area of the first electrode (Txa) 529 is equal to the area of the second electrode (Txb) 528, by using the first electrode (Txa) 529, the second electrode (Txb) 528 and the third electrode (Rx) 524 as mutual capacitance type proximity sensors, it is possible to detect the position where the hand is held over. Furthermore, in the case when the first electrode (Txa) 529 and the second electrode (Txb) 528 are used for touch detection, the third electrode (Rx) 524A is used and the third electrode (Rx) 524B is not used.

In addition, in the case when the area of the first electrode (Txa) is equal to the area of the second electrode (Txb), it is preferred that the voltage amplitude of a signal input to the second electrode (Txb) is larger than the voltage amplitude of a signal input to the first electrode (Txa). By making the voltage amplitude of a signal input to the second electrode (Txb) larger than the voltage amplitude of a signal input to the first electrode (Txa), it is possible to provide a display device with touch detection sensitivity higher than that of a case where the voltage amplitude of a signal input to the second electrode (Txb) is equal to or smaller than the voltage amplitude of a signal input to the first electrode (Txa).

Furthermore, in FIG. 24, for example, non-contact type sensing may use the timing chart shown in FIG. 15. That is, a predetermined signal (Txas) and a predetermined signal (Txbs) may have different pulse widths. For example, in the case when Tt is a unit of time, the predetermined signal (Txas) corresponds to one cycle whereas the predetermined signal (Txbs) is two cycles. In addition, the predetermined signal (Txas) and the predetermined signal (Txbs) may also have different pulse widths and different voltage amplitudes.

In the proximity sensor and the display device according to one embodiment of the present invention, when the detection target, the proximity sensor and the display device are in a non-contact state, even if the area of the first electrode (Txa) and the area of the second electrode (Txb) are equal, a predetermined signal is transmitted to the third electrode (Rx) via a capacitance formed by the second electrode (Txb) and a hand, and a capacitance formed by the hand and the third electrode (Rx). In addition, in the proximity sensor and the display device according to one embodiment of the present invention, when the detection target, the proximity sensor and the display device are in a non-contact state, even if the pulse width of a signal input to the first electrode (Txa) and the pulse width of a signal input to the second electrode (Txb) are different, a predetermined signal is transmitted to the third electrode (Rx) via a capacitance formed by the second electrode (Txb) and a hand, and a capacitance formed by the hand and the third electrode (Rx). Therefore, the proximity sensor and the display device according to one embodiment of the present invention can detect the position where the hand is held over.

In addition, in the proximity sensor and the display device according to one embodiment of the present invention, by making the pulse width of a signal input to the first electrode (Txa) and the pulse width of a signal input to the second electrode (Txb) different, it is possible to improve output sensitivity by using time direction. Even when the voltage amplitude of each signal is small, by using the first electrode (Txa), the second electrode (Txb), and the third electrode (Rx) 524 as mutual capacitance type proximity sensors, it is possible to detect the position where a hand is held over.

Furthermore, it is not absolutely necessary that the area of the first electrode (Txa) and the area of the second electrode (Txb) are equal. For example, the area of the second electrode (Txb) and the area of the first electrode (Txa) may be in a ratio of 6:4 or 7:3. In the case when the area of the first electrode (Txa) is different from the area of the second electrode (Txb), it is preferred that the area of the second electrode (Txb) is larger than the area of the first electrode (Txa).

In addition, it is preferred that the voltage amplitude of a signal input to the second electrode (Txb) is larger than the voltage amplitude of a signal input to the first electrode (Txa). Since it is possible to improve the detection sensitivity of a signal transmitted to the third electrode (Rx) by making the area of the second electrode (Txb) larger than the area of the first electrode (Txa), it is possible to provide a display device with high sensitivity touch detection. In addition, by making the voltage amplitude of a signal input to the second electrode (Txb) larger than the voltage amplitude of a signal input to the first electrode (Txa), it is possible to improve the detection sensitivity of a signal transmitted to the third electrode (Rx). Therefore, by using the proximity sensor and the display device according to one embodiment of the present invention, it is possible to provide a display device with high sensitivity for touch detection.

Fourth Embodiment

In the present embodiment, yet another structure of the proximity sensor and the display device according to one embodiment of the present invention is explained. Furthermore, explanations of structures similar to those of the first to third embodiments may be omitted.

Figure 25:
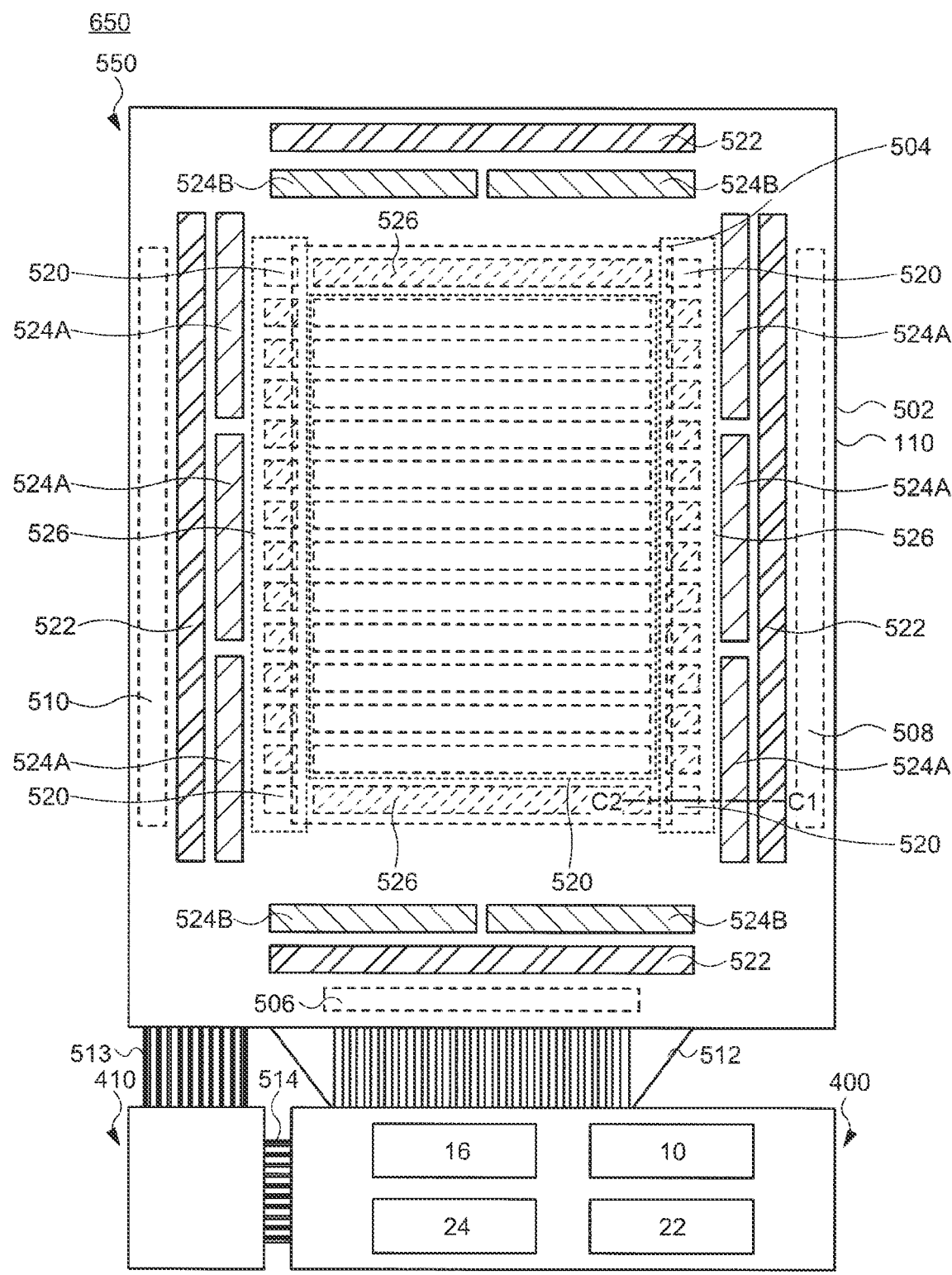
FIG. 25 is a schematic planar diagram showing a structure of a proximity sensor and a display device related to one embodiment of the present invention.
Figure 26:
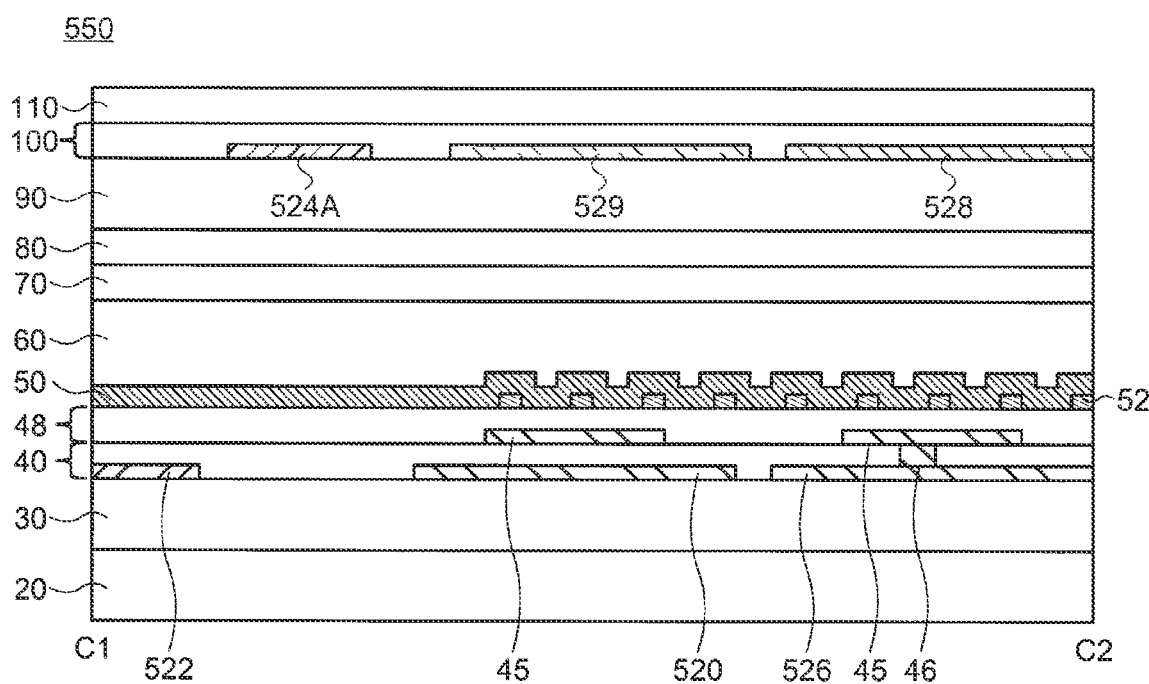
FIG. 26 is a schematic cross-sectional diagram showing a structure of a proximity sensor and a display device related to one embodiment of the present invention.

FIG. 25 is a schematic planar diagram showing a structure of a proximity sensor and a display device according to one embodiment of the present invention. FIG. 26 is a schematic cross-sectional diagram of a proximity sensor and a display device according to one embodiment of the present invention. FIG. 26 shows a cross-section of a region shown by C1 and C2 in FIG. 25. In FIG. 25, in addition to the structure of FIG. 21 which can be realized by electrically connecting divided electrodes in the structure shown in FIG. 16, the first electrode (Txa) 522 is arranged between the third electrode (Rx) 524A or the third electrode (Rx) 524B and the end part of the display panel 550, and a fourth electrode 526 is arranged between the third electrode (Rx) 524A or the third electrode (Rx) and the second electrode (Txb) 520. Apart from this, in FIG. 25, the remaining structure is the same as in FIG. 16, therefore, the same explanation as in FIG. 16 is omitted here. Furthermore, in order to promote understanding, a plurality of second touch electrodes 527 in FIG. 16 are not illustrated.

For example, a constant voltage of 0V is applied to the fourth electrode 526. The fourth electrode 526 is arranged between the second electrode (Txb) 520 and the third electrode (Rx) 524. By applying a constant voltage to the fourth electrode 526, it is possible to shield an electric field being generated between the second electrode (Txb) 520 and the third electrode (Rx) 524. That is, even when the detection object, the proximity sensor, and the display device are in a non-contact state, the hand receives the electric field of the second electrode (Txb) and a predetermined signal is transmitted to the third electrode (Rx) via a capacitance formed by the second electrode (Txb) and the hand, and a capacitance formed by the hand and the third electrode (Rx). When the detection target, the proximity sensor and the display device are in a non-contact state, it is possible to detect the position where the hand is held over by using the first electrode (Txa) 522, the second electrode (Txb) 520 and the third electrode (Rx) 524 as mutual capacitance type proximity sensors.

Fifth Embodiment

In the present embodiment, another structure of the proximity sensor and the display device according to one embodiment of the present invention is explained. Furthermore, explanations of structures similar to those of the first to fourth embodiments may be omitted.

Figure 27:
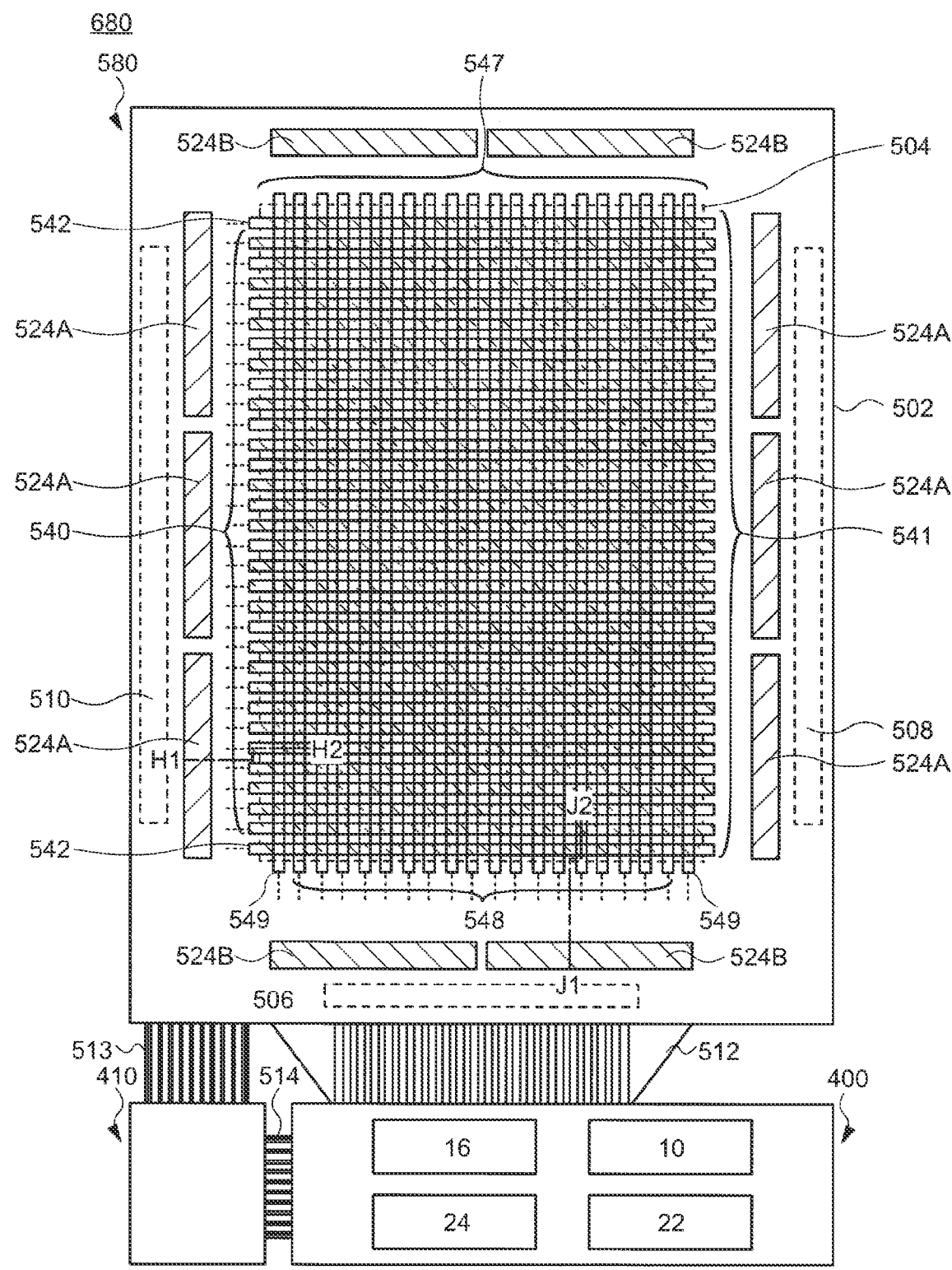
FIG. 27 is a schematic planar diagram showing a structure of a proximity sensor and a display device related to one embodiment of the present invention.
Figure 28:
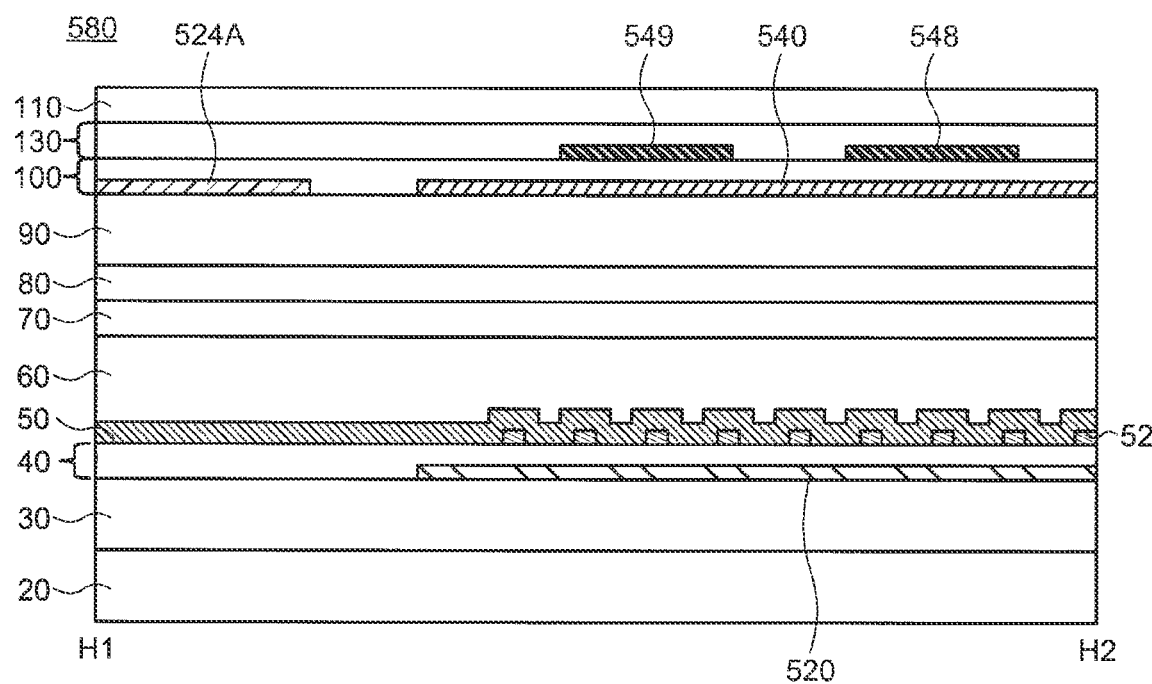
FIG. 28 is a schematic cross-sectional diagram showing a structure of a proximity sensor and a display device related to one embodiment of the present invention.
Figure 29:
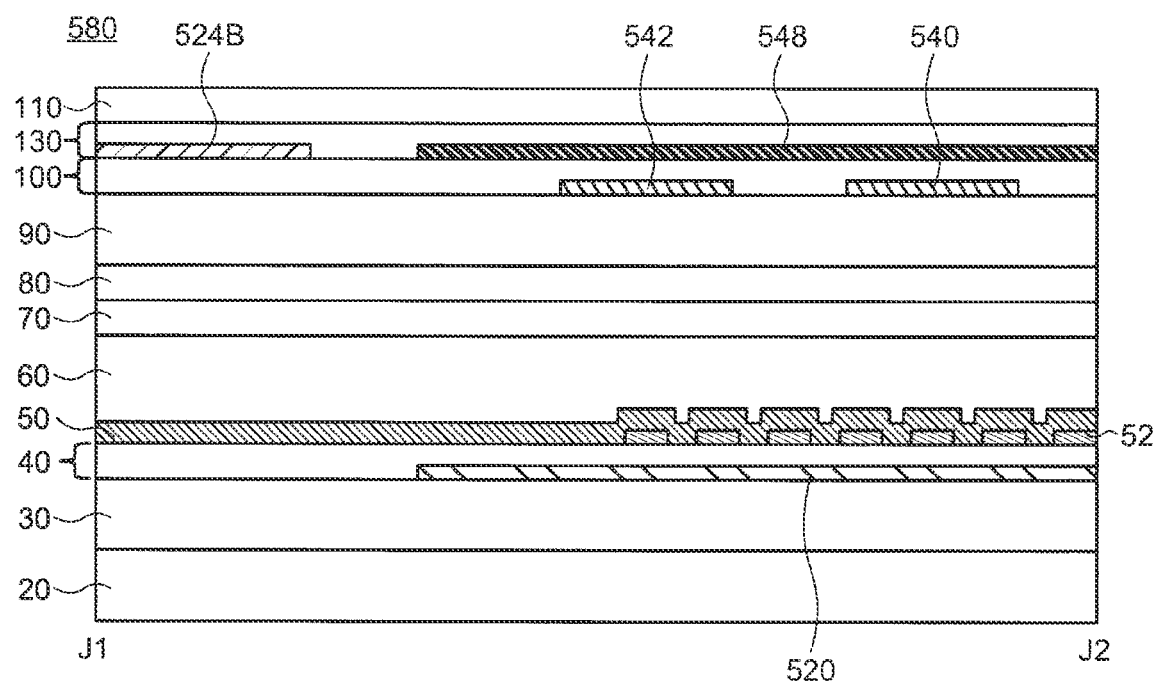
FIG. 29 is a schematic cross-sectional diagram showing a structure of a proximity sensor and a display device related to one embodiment of the present invention.

FIG. 27 is a schematic planar diagram showing an example of the structure of the proximity sensor and the display device according to one embodiment of the present invention. FIG. 28 and FIG. 29 are schematic cross-sectional diagrams of a proximity sensor and a display device according to one embodiment of the present invention. FIG. 28 shows a cross-section of a region shown by H1 and H2 in FIG. 27, and FIG. 29 shows a cross-section of a region shown by J1 and J2 in FIG. 27 respectively.

According to FIG. 27, the display device 680 is formed from a display panel 580, a circuit substrate 400 and a connector 512. Since the circuit substrate 400 and the connector 512 have been explained in FIG. 1, an explanation here is omitted. The display panel 580 includes a plurality of first touch electrodes 541 arranged in parallel in a horizontal direction viewed from the top surface, a plurality of second touch electrodes 547 arranged in parallel in a vertical direction viewed from the top surface, a third electrode (Rx) 524A and 524B, a substrate 502, a display region 504, an image signal line drive circuit 506 and scanning signal line drive circuits 508 and 510. The first touch electrode 541 is formed from a first electrode (Txa) 542 and a second electrode (Txb) 540. The second touch electrode 547 is formed from a first electrode (Txa) 549 and a second electrode (Txb) 548.

In FIG. 27, in normal contact sensing, when a finger contacts the display panel 580, for example, pulse signals are applied in time sequence to the plurality of first touch electrodes 541 in order from the upper electrode in a top surface view, and a change in the pulse signal at the position where the finger contacts the display panel 580 is detected by any one of the plurality of second touch electrodes 547. In this way, it is possible to perform touch detection in a contact state.

In FIG. 27, for example, the timing charts shown in FIG. 10 and FIG. 15 can be used for non-contact type sensing.

It is preferred that the first touch electrode 541 and the second touch electrode 547 shown in FIG. 27 have translucency and conductivity similar to the second electrode (Txb) 520 shown in FIG. 9. For example, it is possible to form the first touch electrode 541 and the second touch electrode 547 using ITO (Indium Tin Oxide) or IZO (Indium Zinc Oxide). Touch detection is performed at a part where the first touch electrode 541 and the second touch electrode 547 intersect.

A cross-section of the display panel 580 shown in FIG. 27 is explained using FIG. 28 and FIG. 29. FIG. 28 and FIG. 29 are different from FIG. 4 and FIG. 5 respectively in that a second touch electrode layer 130 is added without using the connection wiring layer 48. The same contents as in FIG. 4 and FIG. 5 are omitted here. The second touch electrode layer 130 is formed from a first electrode (Txa) 549, a second electrode (Txb) 548, and an insulating film covering each electrode. The insulating film may be a film using an organic resin as a material or a film including an adhesive. For example, the same material used for forming the planarization film 31 explained in FIG. 9 can be used.

Sixth Embodiment

In the present embodiment, a schematic planar diagram showing another structure of the proximity sensor and the display device according to one embodiment of the present invention is explained. Furthermore, explanations of structures similar to those of the first to fifth embodiments may be omitted.

Figure 30:
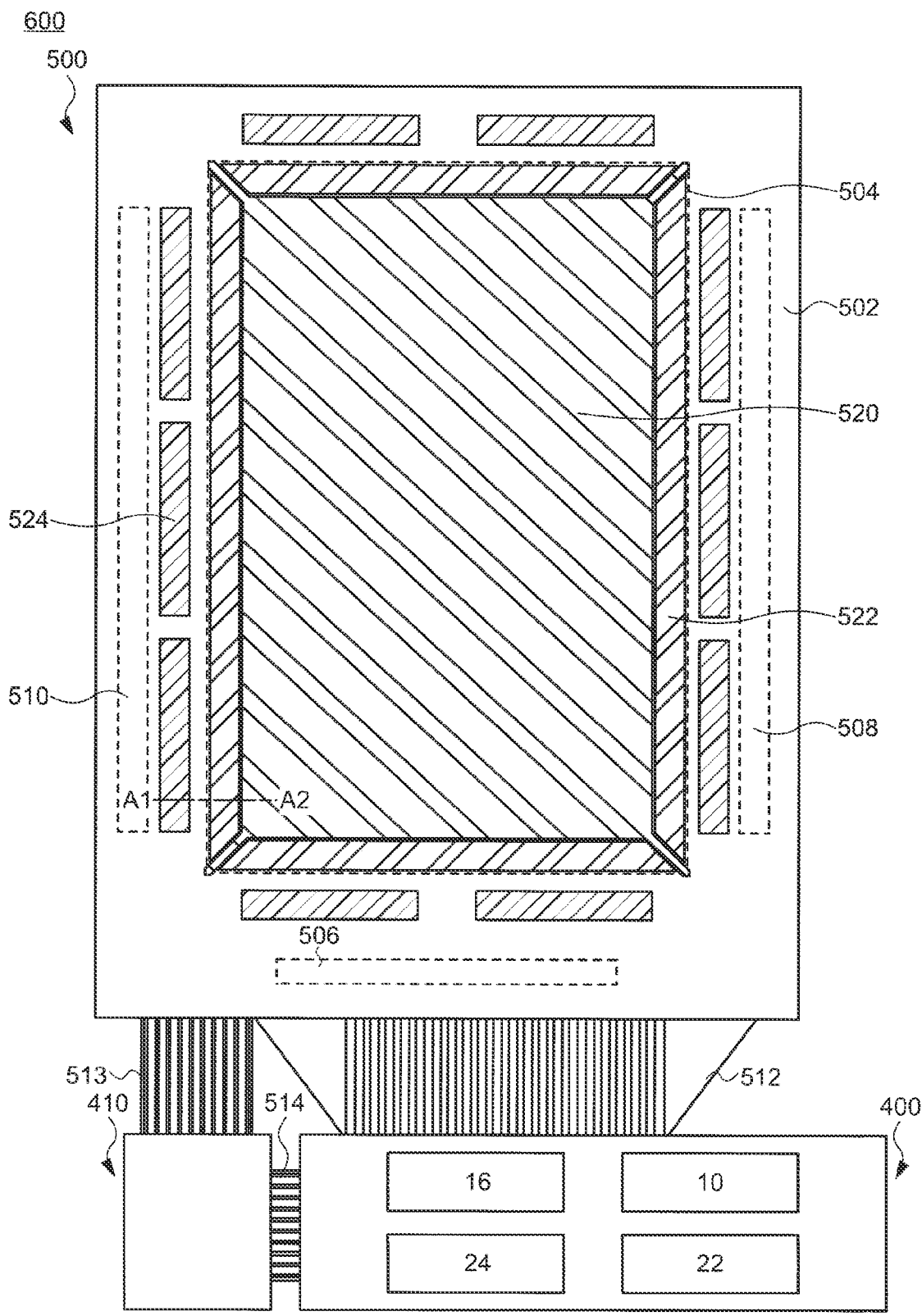
FIG. 30 is a schematic planar diagram showing a structure of a proximity sensor and a display device related to one embodiment of the present invention.

FIG. 30 is a schematic planar diagram showing a structure of a display device 600 according to one embodiment of the present invention. FIG. 30 shows a structure whereby the structure shown in FIG. 21 which can be realized by electrically connecting divided electrodes in the structure shown in FIG. 16, is realized without dividing the electrodes. Apart from this, since the remaining structure is the same as in FIG. 16 and FIG. 21 an explanation is omitted. In the present embodiment, an example in shown which the second touch electrode 527 shown in FIG. 16 is not arranged.

The display panel 500 includes a first electrode (Txa) 522, a second electrode (Txb) 520 and a third electrode (Rx) 524. The area of the first electrode (Txa) 522 is larger than the area of the second electrode (Txb) 520 and the third electrode (Rx) 524.

Figure 31:
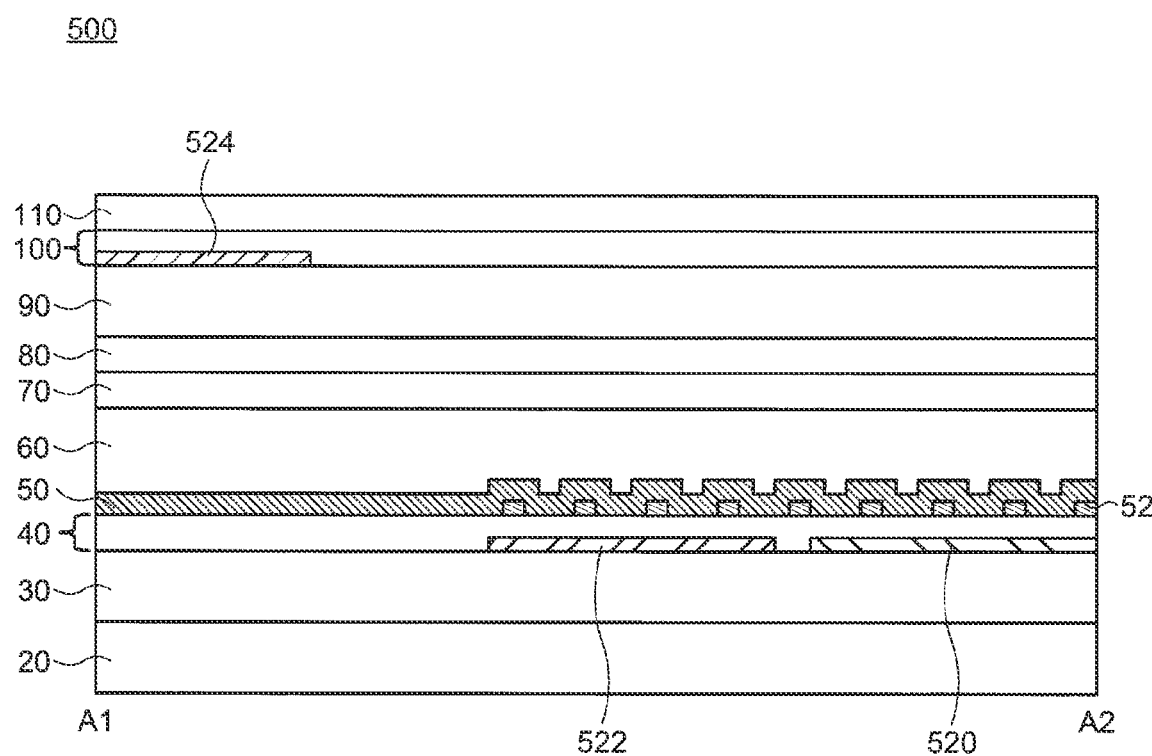
FIG. 31 is a schematic cross-sectional diagram of an example of a structure of a display panel related to one embodiment of the present invention.

FIG. 31 shows a cross-section of a region shown by A1 and A2 shown in FIG. 30. An explanation the same as in FIG. 4 is omitted. The display panel 500 includes a substrate 20, a TFT array layer 30, a common electrode layer 40, a first oriented film 50, a liquid crystal layer 60, a second oriented film 70, a color filter layer 80, an opposing substrate 90, a first touch electrode layer 100, and a substrate 110. Furthermore, the substrate 20 is the same as the substrate 502 shown in FIG. 2. A pixel electrode 52 included in the pixel 120 is arranged between the common electrode layer 40 and the first oriented film 50. In the opposing substrate 90, a third electrode (Rx) 524 is arranged on the rear surface of the surface on which the color filter layer 80 is arranged.

When an image is displayed on the display panel 500, a common voltage of 0V, for example, is applied to the first electrode (Txa) 522 and the second electrode (Txb) 520 which are included in the common electrode layer 40. A liquid crystal element included in the liquid crystal layer 60 is controlled according to the voltage applied to the first electrode (Txa) 522 and the second electrode (Txb) 520 and the voltage applied to the pixel electrode 52. At this time, a common voltage of 0V may also be applied also to the third electrode (Rx) 524.

In the proximity sensor and the display device according to one embodiment of the present invention, the first electrode (Txa), the second electrode (Txb), and the third electrode (Rx) are used as mutual capacitance type proximity sensors. Therefore, even when the detection target, the proximity sensor and the display device are in a non-contact state, a hand receives an electric field of the first electrode (Txa) and a predetermined signal is transmitted to the third electrode (Rx) via a capacitance formed by the first electrode (Txa) and a hand, and a capacitance formed by the hand and the third electrode (Rx). Therefore, by using the proximity sensor and the display device according to one embodiment of the present invention, it is possible to detect the position where the hand is held over.

Seventh Embodiment

In the present embodiment, a schematic planar diagram showing another structure of the proximity sensor and the display device according to one embodiment of the present invention is explained. Furthermore, explanations of structures similar to those of the first to sixth embodiments may be omitted.

Figure 32:
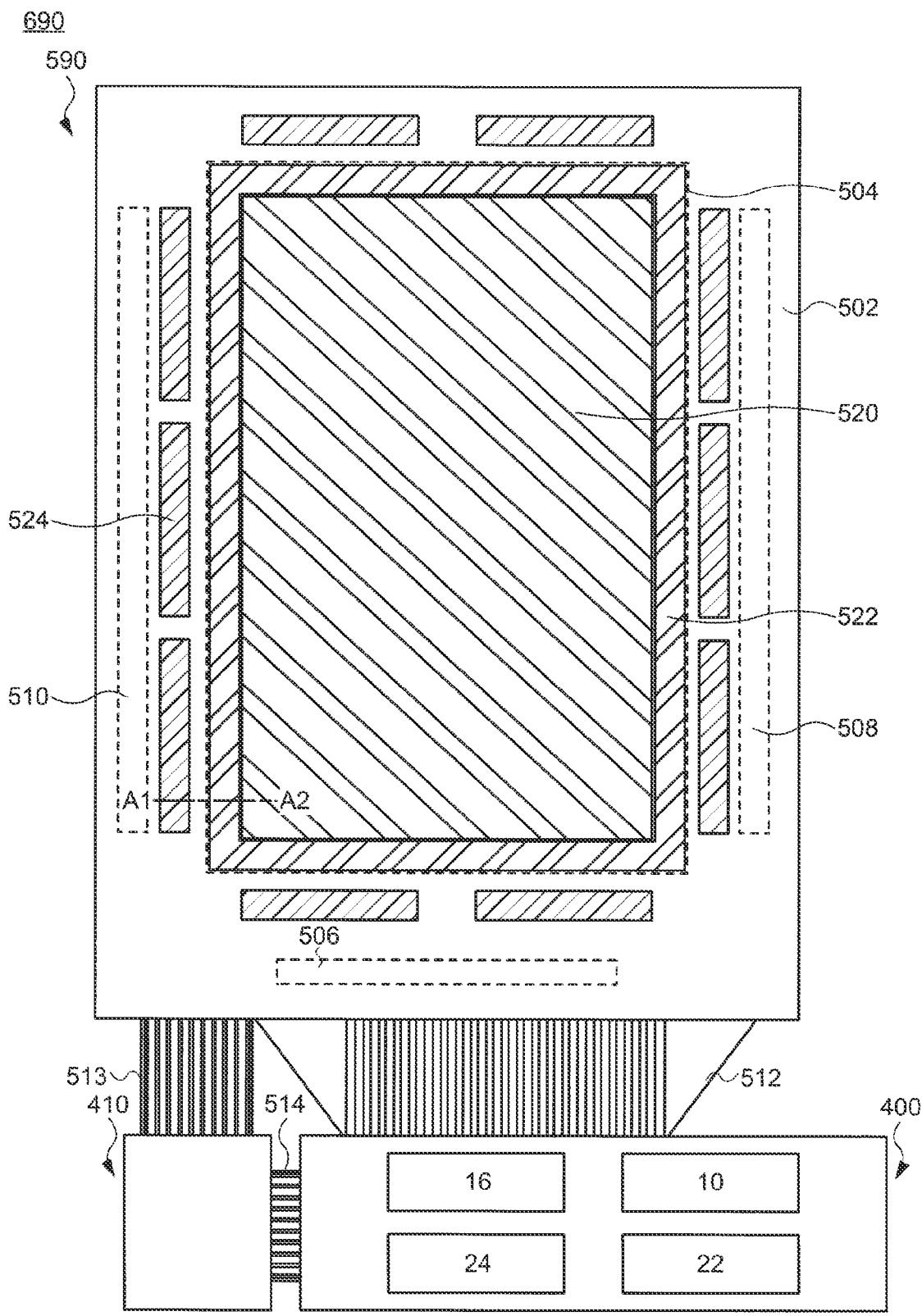
FIG. 32 is a schematic planar diagram showing a structure of a display device related to one embodiment of the present invention.
Figure 33:
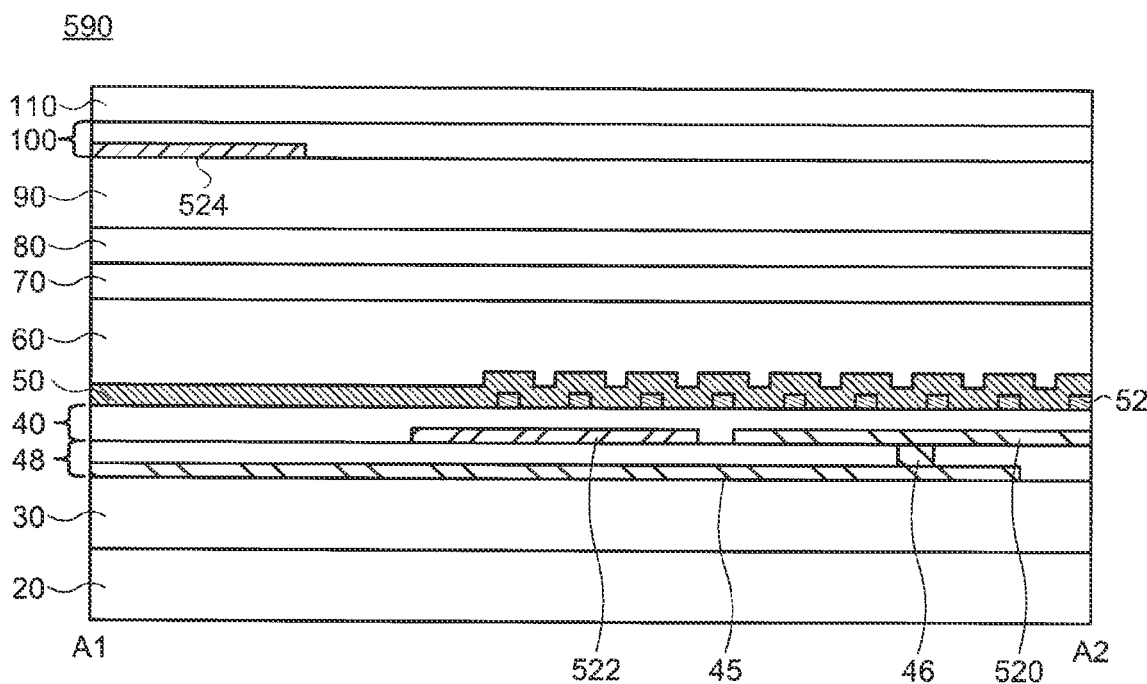
FIG. 33 is a schematic cross-sectional diagram showing a structure of a display device related to one embodiment of the present invention.
Figure 36:
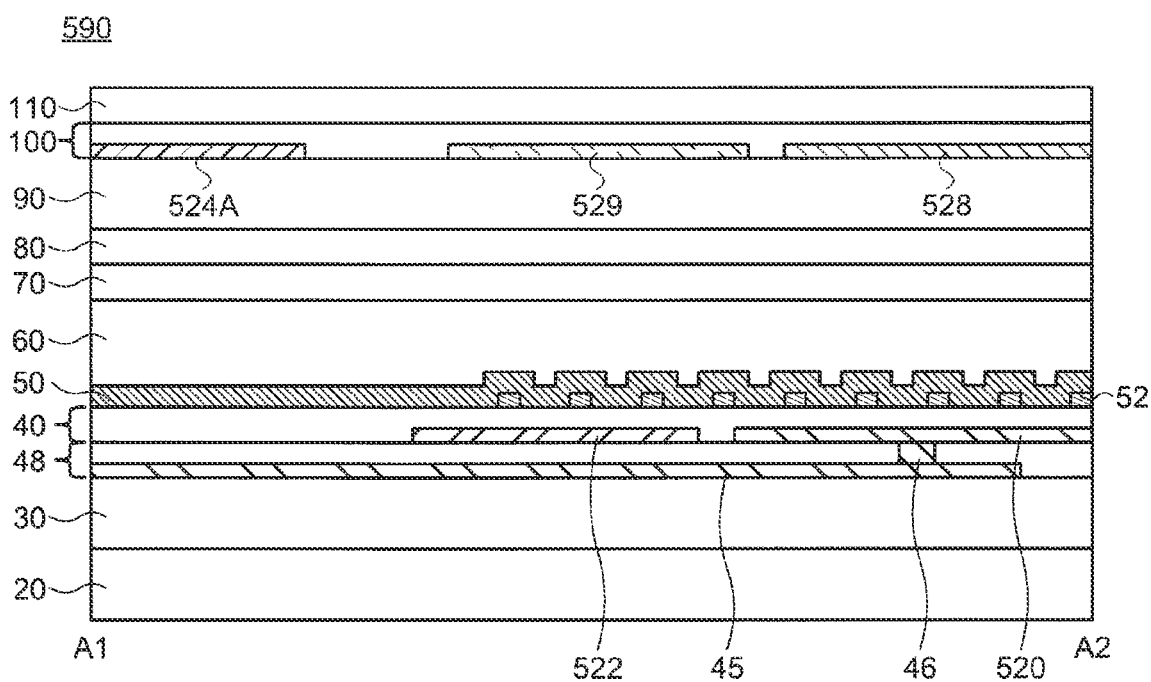
FIG. 36 is a schematic cross-sectional diagram showing a structure of a display device related to one embodiment of the present invention.

FIG. 32 is a schematic planar diagram showing a structure of a display device 690 according to one embodiment of the present invention. FIG. 32 shows a structure whereby the structure shown in FIG. 20 which can be realized by electrically connecting divided electrodes in the structure shown in FIG. 16, is realized without dividing the electrodes. Apart from this, since the remaining structure is the same as in FIG. 16 and FIG. 20, an explanation is omitted. Furthermore, FIG. 33 shows an example in which the second touch electrode 527 shown in FIG. 16 is not arranged. FIG. 36 shows an example in which the second touch electrode 527 shown in FIG. 16 is arranged.

The display panel 590 includes a first electrode (Txa) 522, a second electrode (Txb) 520 and a third electrode (Rx) 524. The area of the first electrode (Txa) 522 is larger than the area of the second electrode (Txb) 520, and the area of the first electrode (Txa) 522 is larger than the area of the third electrode (Rx) 524.

FIG. 33 shows a cross-section of a region shown by A1 and A2 shown in FIG. 32. FIG. 33 is different from the structure of FIG. 4 and FIG. 22 in that the stacking of common electrode layer 40 and the connection wiring layer 48 is different. In addition, the second touch electrode 527 shown in FIG. 16 is not arranged in FIG. 33. More specifically, in FIG. 33, the connection wiring layer 48 is closer to the substrate 20 than the common electrode layer 40, and the common electrode layer 40 is stacked on the connection wiring layer 48. In the present embodiment, it is assumed that a third opening part 46 is included in the connection wiring layer 48. FIG. 33 is the same as FIG. 4 and FIG. 22 except for that explained above, and an explanation thereof is omitted here. The substrate 20 is the same as the substrate 502 shown in FIG. 2. The pixel electrode 52 included in the pixel 120 is arranged between the common electrode layer 40 and the first oriented film 50. In the opposing substrate 90, a third electrode (Rx) 524 is arranged on the rear surface of the surface on which the color filter layer 80 is arranged. Furthermore, in order to easily view FIG. 33, the size of the comb shaped linear member of the pixel electrode 52 is illustrated large so that it can be compared with the first electrode (Txa) 522 and the like. Actually, the size of the comb shaped linear member of the pixel electrode 52 is much smaller compared to the first electrode (Txa) 522. For example, as is shown in FIG. 8, three pixel electrodes 52 are connected with a plurality of narrow linear members, and the space between the linear members is formed in a slit shape. The number of the linear members and the number of the slits between the linear members is not limited to the example shown in FIG. 8.

Furthermore. the structure in which the common electrode layer 40 is stacked on the connection wiring layer 48 in the present embodiment may also be applied to the first to fourth embodiments in the present specification.

Figure 34:
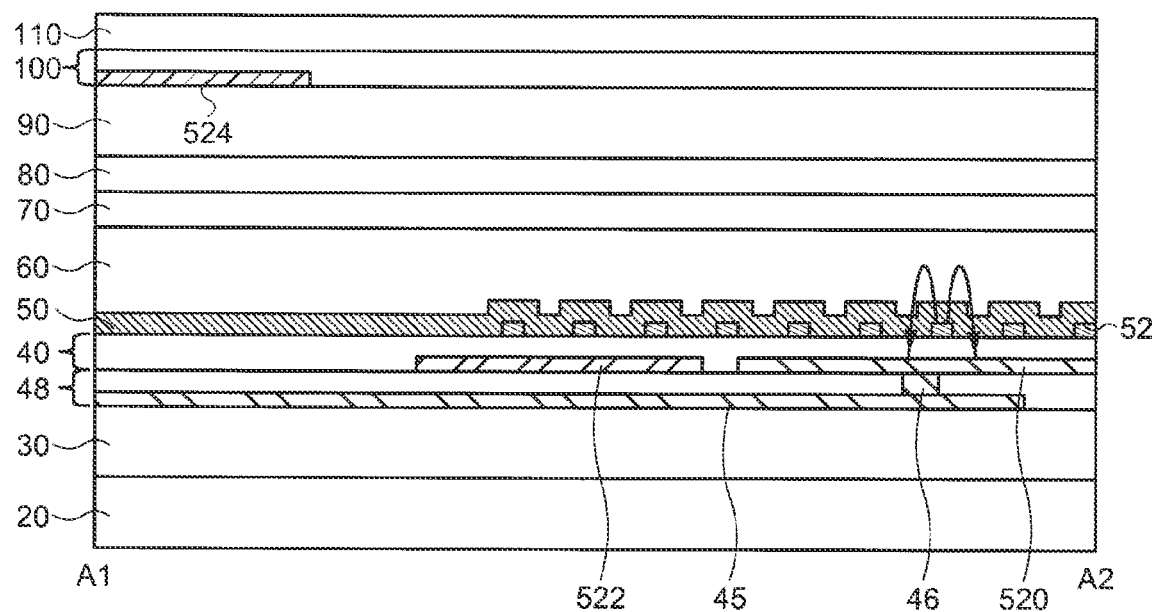
FIG. 34 is a schematic cross-sectional diagram showing an example of electric lines of force in a display device related to one embodiment of the present invention.

FIG. 34 shows electric lines of force in an electric field between the pixel electrode 52 and the second electrode (Txb) 520 when an image is displayed on the display panel 590. In an FFS mode, a lateral electric field (for example, an electric field almost parallel to a main surface of a substrate in a fringe electric field) formed between the first electrode (Txa) 522 and the second electrode (Txb) 520 included in the pixel electrode 52 and the common electrode layer 40 is mainly utilized and orientation of liquid crystal elements which form a liquid crystal layer 60 is controlled. For example, a common voltage of 0V is applied to the first electrode (Txa) 522 and the second electrode (Txb) 520 included in the common electrode layer 40. The liquid crystal elements included in the liquid crystal layer 60 are controlled according to the common voltage applied to the first electrode (Txa) 522 and the second electrode (Txb) 520 and the voltage applied to the pixel electrode 52. At this time, a common voltage of 0V may also be applied to the third electrode (Rx) 524.

Figure 35:
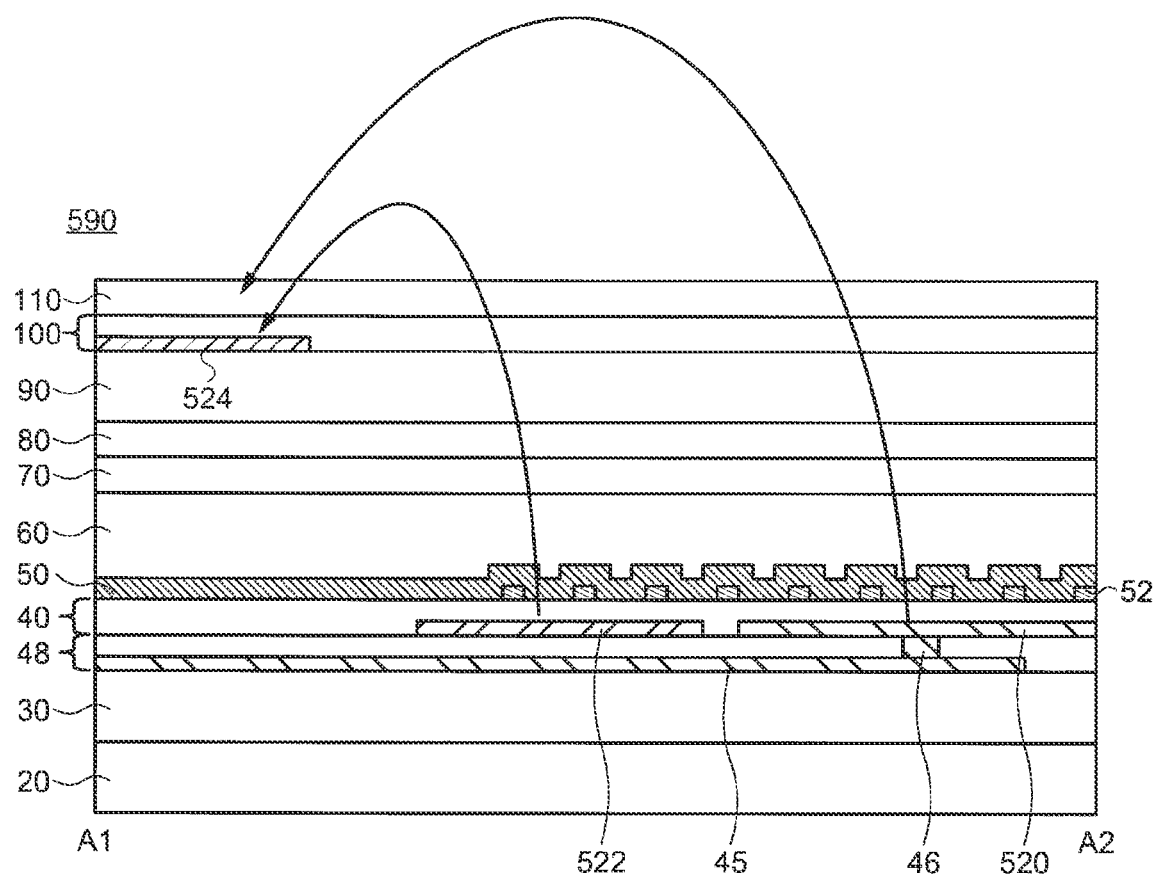
FIG. 35 is a schematic cross-sectional diagram showing an example of electric lines of force in a display device related to one embodiment of the present invention.

FIG. 35 shows electric lines of force in an electric field generated between the first electrode (Txa) 522 and the second electrode (Txb) 520 and the third electrode (Rx) 524 when touch detection is performed. Touch detection and writing of new image data to a pixel are not performed at the same time. In FIG. 35, for example, the timing chart shown in FIG. 11 can be used for non-contact sensing. That is, when a hand is held over the display panel 590, for example, a predetermined signal is input to the first electrode (Txa) 522 and a signal which has a different phase to the phase of the predetermined signal is input to the second electrode (Txb) 520, and thereby the hand receives an electric field of the second electrode (Txb) 520. A predetermined signal is transmitted to the third electrode (Rx) 524 via the capacitance formed by the second electrode (Txb) 520 and a hand, and the capacitance formed by the hand and the third electrode (Rx) 524.

FIG. 36 shows an example in which the second touch electrode 527 shown in FIG. 16 is arranged in addition to the structure in FIG. 33. The second touch electrode 527 has a first electrode (Txa) 529 and a second electrode (Txb) 528. In the display panel 590 according to one embodiment of the present invention, the first electrode (Txa) 529 and the second electrode (Txb) 528 included in the second touch electrode 527 have the same function as the third electrode (Rx) 524A. That is, when touch detection is performed, a detection target such as a human finger touches or comes close to the display region 504 (touching and comes close to are collectively referred to herein as "touch") via the first electrode (Txa) 522 or the second electrode (Txb) 520, and the second touch electrode 527 or the third electrode (Rx) 524A. In this way, in addition to parasitic capacitance at the first electrode (Txa) 522 or the second electrode (Txb) 520 and the second touch electrode 527 or the third electrode (Rx) 524A, a capacitance generated between the detection target and first electrode (Txa) 522, the second electrode (Txb) 520, the second touch electrode 527 or the third electrode (Rx) 524A is added. The position of the touch is detected by reading this change.

In the proximity sensor and the display device according to one embodiment of the present invention, the second electrode (Txb) is not divided. In the proximity sensor and the display device according to one embodiment of the present invention, the second electrode (Txb) has a larger area than the first electrode (Txa) and the second electrode (Txb) is one electrode. In the proximity sensor and the display device according to one embodiment of the present invention, even when the detection target, the proximity sensor and the display device are in a non-contact state and the second electrode (Txb) is a single electrode having a large area, by inputting a predetermined signal to the first electrode (Txa) and inputting a signal having a different phase to the phase of the predetermined signal to the second electrode (Txb), the hand receives an electric field of the second electrode (Txb), and the predetermined signal is transmitted to the third electrode (Rx) via a capacitance formed by the second electrode (Txb) and a hand, and a capacitance formed by the hand and the third electrode (Rx). Therefore, the proximity sensor and the display device according to one embodiment of the present invention can detect the position where the hand is held over.

Each embodiment described above as embodiments of the present invention can be implemented in appropriate combination as long as they do not contradict each other.

Although the image processing device and the image processing method of the image processing device and a display system installed with these are mainly exemplified as disclosed examples in the present disclosure, a display device displaying the image data processed by the image processing device can be any flat panel type display device such as another self-light emitting display device, a liquid crystal display device, or an electronic paper type display device having an electrophoretic element or the like. In addition, the present invention can be applied from medium to small size to large size devices without any particular limitations.

Even if an effect is another action or effect different from the action and effect brought about by the aspects of each embodiment described above, those that are obvious from the description of the present specification or those easily predictable by a person skilled in the art will naturally be interpreted as being provided by the present invention.

What is claimed is:

1. A proximity sensor comprising:
   a plurality of first electrodes arranged in a frame-shape on a substrate;
   a second electrode arranged inside the framed-shaped first electrodes; and
   a plurality of third electrodes on the substrate arranged along each of four sides of the substrate,
   wherein
   the first electrodes are arranged outside the second electrode,
   the third electrodes are arranged outside the first electrodes, and
   a total area of the second electrode is larger than a total area of the third electrodes.

2. The proximity sensor according to claim 1, wherein the first electrodes are input with a first signal and the second electrode is input with a second signal different from the first signal.

3. The proximity sensor according to claim 2, wherein the second signal has a reverse phase of the first signal.

4. The proximity sensor according to claim 1, wherein an area of the second electrode is larger than an area of one of the first electrodes on a same layer as the first electrodes on the substrate.

5. The proximity sensor according to claim 1, wherein an amplitude of the second signal is equal to or larger than an amplitude of the first signal.

6. The proximity sensor according to claim 1, wherein a pulse width of the second signal is narrower than a pulse width of the first signal, and a number of pulses of the second signal per predetermined period of time is more than a number of pulses of the first signal.

* * * * *